US012693220B2

(12) United States Patent
Zhao et al.

(10) Patent No.: US 12,693,220 B2
(45) Date of Patent: Jul. 28, 2026

(54) FAULT DIAGNOSIS APPARATUS BASED ON FLUORESCENCE MULTIVARIATE CORRECTION ANALYSIS OF TRANSFORMER OIL

(71) Applicants:STATE GRID ANHUI ELECTRIC POWER RESEARCH INSTITUTE, Anhui (CN); STATE GRID ANHUI ELECTRIC POWER CO., LTD., Anhui (CN); HEFEI INSTITUTES OF PHYSICAL SCIENCE, CHINESE ACADEMY OF SCIENCES, Anhui (CN)

(72) Inventors: Yue Zhao, Anhui (CN); Jia Xie, Anhui (CN); Fengxiang Ma, Anhui (CN); Yumei Song, Anhui (CN); Feng Zhu, Anhui (CN); Anjing Wang, Anhui (CN); Wei Liu, Anhui (CN); Shan Zhu, Anhui (CN); Jiong Qi, Anhui (CN); Zien Liu, Anhui (CN); Taiyun Zhu, Anhui (CN); Jun Cao, Anhui (CN); Jianlin Li, Anhui (CN); Chao Luo, Anhui (CN); Qingtao Chen, Anhui (CN); Chen Hang, Anhui (CN)

(73) Assignees: STATE GRID ANHUI ELECTRIC POWER RESEARCH INSTITUTE, Anhui (CN); STATE GRID ANHUI ELECTRIC POWER CO., LTD., Anhui (CN); HEFEI INSTITUTES OF PHYSICAL SCIENCE, CHINESE ACADEMY OF SCIENCES, Anhui (CN)

( * ) Notice: Subject to any disclaimer, the term of this patent is extended or adjusted under 35 U.S.C. 154(b) by 274 days.

(21) Appl. No.: 18/560,592

(22) PCT Filed: Sep. 8, 2023

(86) PCT No.: PCT/CN2023/117798
§ 371 (c)(1),
(2) Date: Nov. 13, 2023

(87) PCT Pub. No.: WO2024/119933
PCT Pub. Date: Jun. 13, 2024

(65) Prior Publication Data
US 2025/0076197 A1    Mar. 6, 2025

(30) Foreign Application Priority Data

Dec. 5, 2022    (CN) ......................... 202211549718.7

(51) Int. Cl.
*G01N 21/64*        (2006.01)
*G01N 1/14*        (2006.01)
        (Continued)

(52) U.S. Cl.
CPC ............... *G01N 21/64* (2013.01); *G01N 1/14* (2013.01); *G01N 21/93* (2013.01);
        (Continued)

(58) Field of Classification Search
CPC .......... G01N 21/64; G01N 1/14; G01N 21/93; G01N 2021/6417; G01N 2201/0621;
        (Continued)

(56) References Cited

U.S. PATENT DOCUMENTS 6,166,804 A        12/2000    Potyrailo et al.
2014/0146317 A1*    5/2014    Arimoto ............... G01J 3/0297
                                356/402

FOREIGN PATENT DOCUMENTS

CA        640214 A        4/1962
CN        2819244 Y        9/2006
        (Continued)

OTHER PUBLICATIONS

Huang translation (Year: 2020).*

(Continued)

*Primary Examiner* — Kara E. Geisel

(74) *Attorney, Agent, or Firm* — ArentFox Schiff LLP; Joseph M. Maraia

(57) ABSTRACT

Provided are a fault diagnosis apparatus and method based on fluorescence multivariate correction analysis of transformer oil, relating to the field of transformer fault diagnosis technology. Thus, the problem of large volume and weight of the apparatus, high costs, and inconvenience to use caused when in the related art, a fluorescence spectrometer is directly used to acquire the fluorescence spectrum of transformer oil is solved. The monochromatic excitation light of an optimal excitation wavelength generated by a fluorescence excitation source is used to excite the transformer oil in a fluorescence excitation detection apparatus to generate fluorescence. The fluorescence excitation detection apparatus generates the fluorescence according to the input monochromatic excitation light and inputs the fluorescence to a fluorescence signal acquisition and analysis apparatus. Since the fluorescence signal acquisition and analysis apparatus acquires and analyzes the fluorescence signal emitted by the transformer oil by using a multivariate correction filter group, the emission monochromator component of the fluorescence spectrometer is replaced. In this manner, the equipment costs and the equipment volume are reduced, and data processing is rapid. Thus, the cost performance of the fault detection of the transformer oil is improved, thereby implementing the engineering application of the fluorescence monitoring technology in the online diagnosis of the transformer failure.

14 Claims, 32 Drawing Sheets

(51) Int. Cl.
   *G01N 21/93*     (2006.01)
   *G01R 31/12*     (2020.01)
(52) U.S. Cl.
   CPC ..... *G01R 31/1218* (2013.01); *G01R 31/1281* (2013.01); *G01N 2021/6417* (2013.01); *G01N 2201/0621* (2013.01)

(58) Field of Classification Search
   CPC ......... G01N 2021/6421; G01N 21/645; G01R 31/1218; G01R 31/1281; Y04S 10/52
   See application file for complete search history.

(56)          References Cited

FOREIGN PATENT DOCUMENTS

| | | | | | |
|---|---|---|---|---|---|
| CN | 110726704 | A | * | 1/2020 | ............. G01N 21/64 |
| CN | 209946182 | U | | 1/2020 | |
| CN | 111103277 | A | | 5/2020 | |
| CN | 112345489 | A | | 2/2021 | |
| CN | 112382471 | A | | 2/2021 | |
| CN | 112748082 | A | | 5/2021 | |
| CN | 113109682 | A | * | 7/2021 | ......... G01R 31/1281 |
| CN | 214158620 | U | | 9/2021 | |
| CN | 113616158 | A | | 11/2021 | |
| CN | 113670873 | A | | 11/2021 | |
| CN | 113720808 | A | | 11/2021 | |
| CN | 214794471 | U | * | 11/2021 | |
| CN | 214895626 | U | * | 11/2021 | |
| CN | 114117931 | A | | 3/2022 | |
| CN | 216433398 | U | | 5/2022 | |
| CN | 216956034 | U | * | 7/2022 | |
| CN | 115791294 | A | | 3/2023 | |
| CN | 115791732 | A | | 3/2023 | |
| CN | 116087162 | A | | 5/2023 | |
| CN | 116183563 | A | | 5/2023 | |
| CN | 219038828 | U | | 5/2023 | |
| CN | 116298712 | A | | 6/2023 | |
| JP | H1019804 | A | | 1/1998 | |
| JP | H11345716 | A | | 12/1999 | |
| JP | 2007155494 | A | * | 6/2007 | |
| JP | 2012193988 | A | | 10/2012 | |
| JP | 2018165648 | A | | 10/2018 | |

OTHER PUBLICATIONS

Zhao translation (Year: 2021).*
Mimata translation (Year: 2007).*
Ma'034 (Year: 2022).*
Notice of Reasons for Refusal received in JP Application No. 2023-570119 on Mar. 17, 2025 and English translation thereof, 6 pages.
International search report for related International Application No. PCT/CN2023/117798 mailed Nov. 23, 2023 (6 pgs).
Zhao, et al, "Research on Electric Breakdown Fault Diagnosis Model of Transformer Insulated Oil Based on Fluorescent Double-Color Ratio," Spectroscopy and Spectral Analysis, Apr. 2022, vol. 42, No. 4, pp. 1134-1138.
CN Office Action dated Aug. 22, 2025, for CN Application No. 202211549718.7 (23 pgs.).
Chen W. et al., Gas in Oil Analysis in Transformers Based on Photoacoustic Spectrometry, China Academic Journal Electronic Publishing House; Aug. 10, 2007; (Abstract provided) (5 pgs.).

* cited by examiner

| |
|---|
| Evacuate the internal pipeline of the oil extraction apparatus 11 and the detection cell 1312 |

| |
|---|
| Extract the transformer oil into the fluorescence excitation detection apparatus 13 |

| |
|---|
| Backfill the transformer oil into the transformer oil tank |

S1

S2

S3

| Different types of transformer insulating oil (different kinds, and different aging conditions) |
| Determine an excitation wavelength range |
| Compare the characteristic peak intensity and the coefficient of variation |
| Find the optimal excitation wavelength |

Positive part of the multivariate correction filters and transmittance curve

Negative part of the multivariate correction filters and transmittance curve

FAULT DIAGNOSIS APPARATUS BASED ON FLUORESCENCE MULTIVARIATE CORRECTION ANALYSIS OF TRANSFORMER OIL

CROSS-REFERENCE TO RELATED APPLICATIONS

This is a National Stage Application, filed under 35 U.S.C. 371, of International Patent Application No. PCT/CN2023/117798, filed on Sep. 8, 2023, which claims priority to Chinese Patent No. 202211549718.7 filed with the China National Intellectual Property Administration (CNIPA) on Dec. 5, 2022, the disclosures of which are incorporated herein by reference in their entireties.

TECHNICAL FIELD

The present application belongs to the field of transformer fault diagnosis technology, for example, a fault diagnosis apparatus and method based on fluorescence multivariate correction analysis of transformer oil.

BACKGROUND

As the core of energy conversion in the process of electric energy production and distribution, transformers have a huge number and a widespread impact, and the operation state of the transformer directly affects the safe and reliable operation of a power system. Once an accident occurs on the transformer, it may not only damage expensive electric equipment (the price of a single transformer is as high as 50 million yuan), but it may also cause a large-scale power outage, even casualties, and the environmental contamination, as well as huge economic and social losses. Therefore, it becomes particularly important to monitor the operation state of transformers.

Transformer oil refers to a type of insulating oil used in oil-filled electrical equipment, such as transformers, reactors, transducers, sleeves, and oil switches, for insulation, cooling, and arc extinction functions. Transformer oil is a fractionated product of petroleum, and the principal components of transformer oil are alkanes, naphthenic saturated hydrocarbons, aromatic unsaturated hydrocarbons, and non-hydrocarbon compounds. The transformer oil may emit fluorescence under ultraviolet or X-ray irradiation. The fluorescence refers to a cold-luminescence phenomenon of photoluminescence. When a substance at ambient temperature is irradiated by incident light (typically ultraviolet light or X-rays) of a certain wavelength, the substance enters an excited state after absorbing light energy, then immediately de-excites, and emits outgoing light having a wavelength (typically in a visible light band) longer than the wavelength of the incident light. Moreover, once the incident light stops, the light emission phenomenon disappears immediately. The outgoing light having such property is referred to as fluorescence.

With the development of transformer operation state monitoring technology, mature monitoring methods such as a partial discharge test method for on-site detection, a physical-chemical test method for insulating oil based on off-line sampling, and an oil dissolved gas analysis (DGA) technology for online automatic monitoring are successively emerged. The partial discharge test is usually used for the on-site inspection of an insulation state before the equipment is put into operation or after the equipment is maintained. The physical-chemical test of insulating oil needs to accurately measure the physical and chemical properties of the insulating oil in a laboratory. Both the preceding two methods cannot implement the online automatic monitoring and analysis of the state of a transformer during operation. The DGA is the technology for online diagnosing the state of a transformer by analyzing the dissolved gas content in oil and has the advantages of not being affected by various electromagnetic interference, high reliability of the obtained data, and relatively mature technology. The DGA gradually becomes the mainstream of the transformer operation state monitoring technology. However, with the increasing application of the DGA, the following shortcomings are exposed: (1) When a main transformer discharges without producing gas or with a very small amount of released gas, the DGA cannot perform detection or cannot detect gas of a low concentration; and (2) a discharge failure occurs in the main transformer, the discharge capacity increases continuously in a short time, and a large amount of gas is rapidly released, but the single-analysis time of the current DGA analysis method takes 2 hours. Both misdetection and delayed monitoring may cause certain safety hazards. Thus, in recent years, more and more scholars have studied on a truly fast, real-time, and safe transformer operation state monitoring technology based on fluorescence monitoring.

The fluorescence detection technology of a transformer operation state has many advantages such as high detection speed, real-time response, non-destructive detection, and high precision, which has great potential in the field of transformer operation state detection technologies. For example, in the Chinese patent document entitled "Fluorescence online detection apparatus of transformer insulating oil" with publication No. CN113109682A filed on Jul. 13, 2021, the disclosed fluorescence online detection apparatus of transformer insulating oil has the characteristics of high sensitivity, short analysis time, immunity to the interference of surrounding magnetic field and electric field, and good stability and reproducibility. Thus, the online fault detection requirements of a transformer during operation can be implemented. However, the transformer fluorescence monitoring in the related art is performed by using scientific-grade equipment through a fluorescence spectrometer under a laboratory condition to acquire the fluorescence spectrum of insulating oil, and a method such as pattern recognition is used for diagnosing a transformer operation failure. As a result, the online real-time monitoring capability is limited by the large size of equipment, high costs, and long data acquisition and processing time.

SUMMARY

The present application aims to design a transformer fault diagnosis apparatus based on fluorescence analysis of transformer oil, which is small in volume and weight, low in cost, and convenient to use. Thus, the case of the large volume and weight of the apparatus, high costs, and inconvenience to use which exists in the transformer fault diagnosis apparatus in the related art based on fluorescence analysis of transformer oil directly using a fluorescence spectrometer for acquiring the fluorescence spectrum of the transformer oil is avoided.

Embodiments of the present application provide a fault diagnosis apparatus based on fluorescence multivariate correction analysis of transformer oil. The apparatus includes an apparatus housing, an oil extraction apparatus, a fluorescence excitation source, a fluorescence excitation detection apparatus, a fluorescence signal acquisition and analysis apparatus, and a display screen. The oil extraction apparatus, the fluorescence excitation source, the fluorescence excitation detection apparatus, and the fluorescence signal acquisition and analysis apparatus are all disposed inside the apparatus housing. The display screen is disposed on the front panel of the apparatus housing. The oil extraction apparatus is connected to an external transformer oil tank and the fluorescence excitation detection apparatus separately through a pipe in a sealed manner. The fluorescence excitation source is connected to the fluorescence excitation detection apparatus through an optical fiber. The fluorescence excitation detection apparatus is connected to the fluorescence signal acquisition and analysis apparatus through an optical fiber. The oil extraction apparatus is configured to input the transformer oil in the transformer oil tank into the fluorescence excitation detection apparatus by means of the pressure difference between the transformer oil tank and the evacuated fluorescence excitation detection apparatus. The monochromatic excitation light of an optimal excitation wavelength generated by the fluorescent excitation source is used for exciting the transformer oil in the fluorescence excitation detection apparatus to generate fluorescence. The fluorescence excitation detection apparatus generates the fluorescence according to the input monochromatic excitation light and inputs the fluorescence into the fluorescence signal acquisition and analysis apparatus. The fluorescence signal acquisition and analysis apparatus is configured to acquire the fluorescence signal emitted by the transformer oil by using a multivariate correction filter group and analyze the type of a transformer failure. The display screen is configured to display a result acquired and analyzed by the fluorescence signal acquisition and analysis apparatus.

Figure 1:
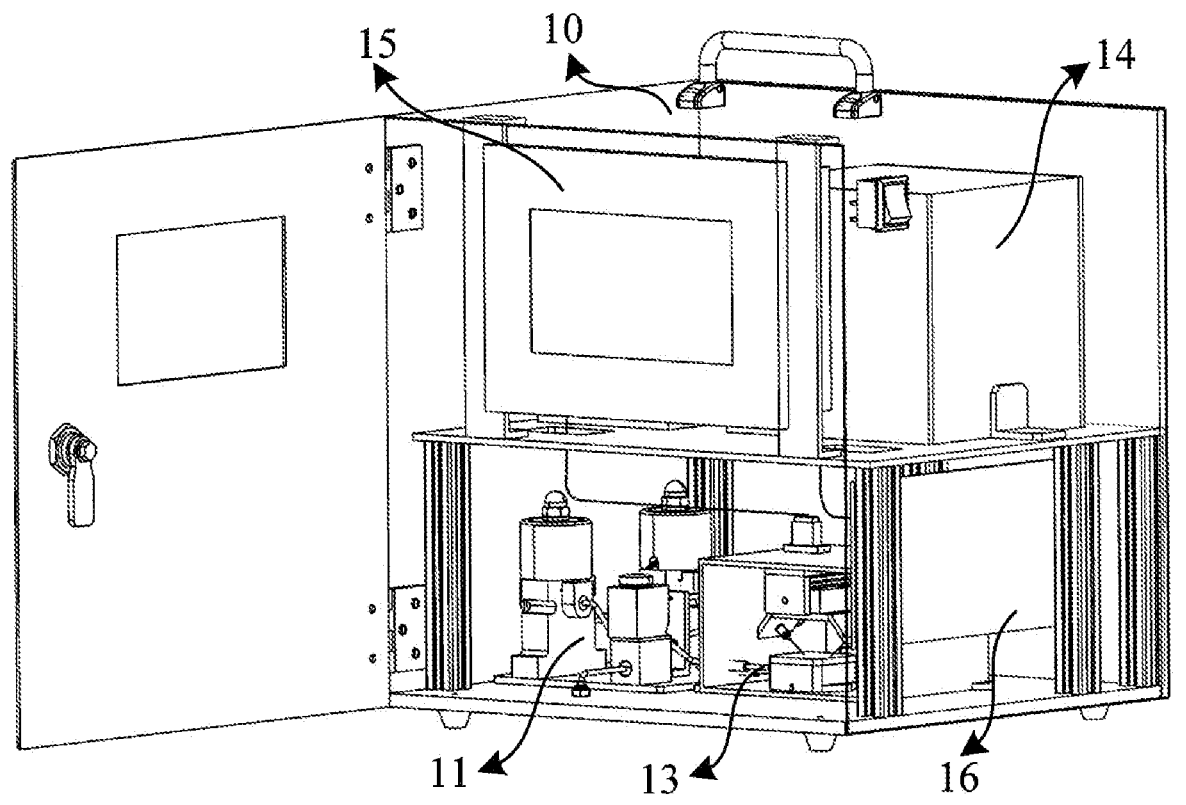
FIG. 1 is a stereo view of a fault diagnosis apparatus based on fluorescence multivariate correction analysis of transformer oil according to the present application.
Figure 2:
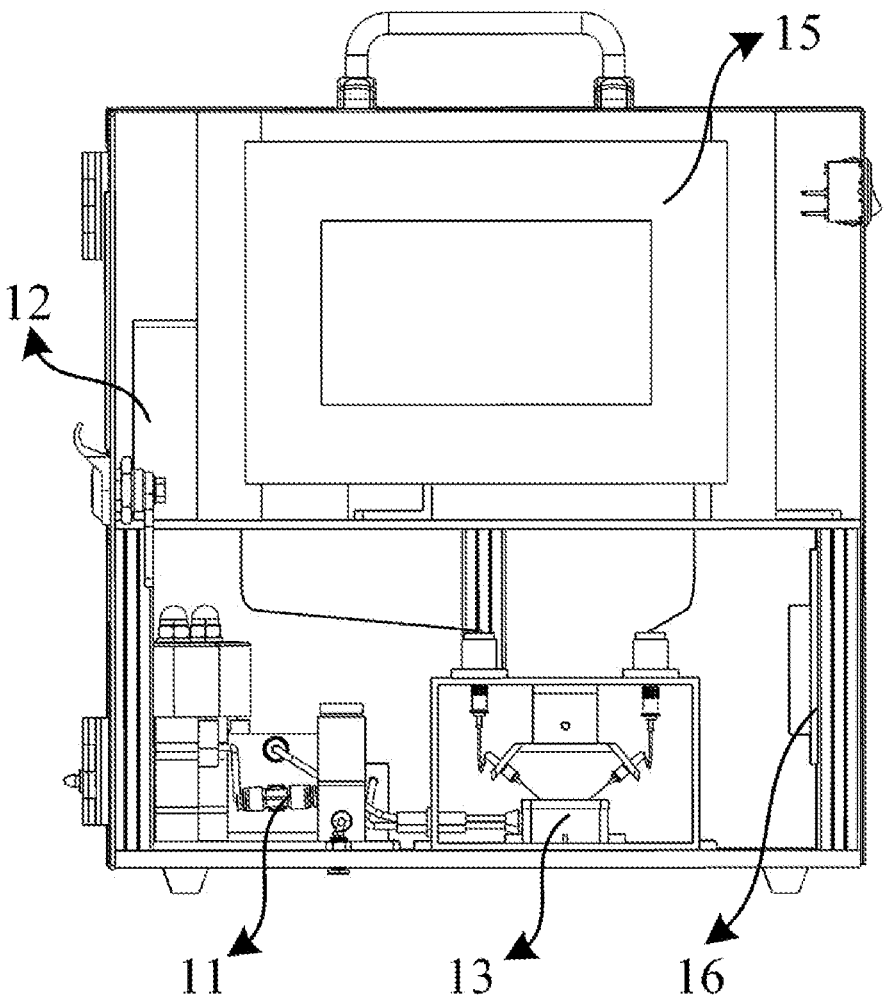
FIG. 2 is a front view of a fault diagnosis apparatus based on fluorescence multivariate correction analysis of transformer oil according to the present application.
Figure 3:
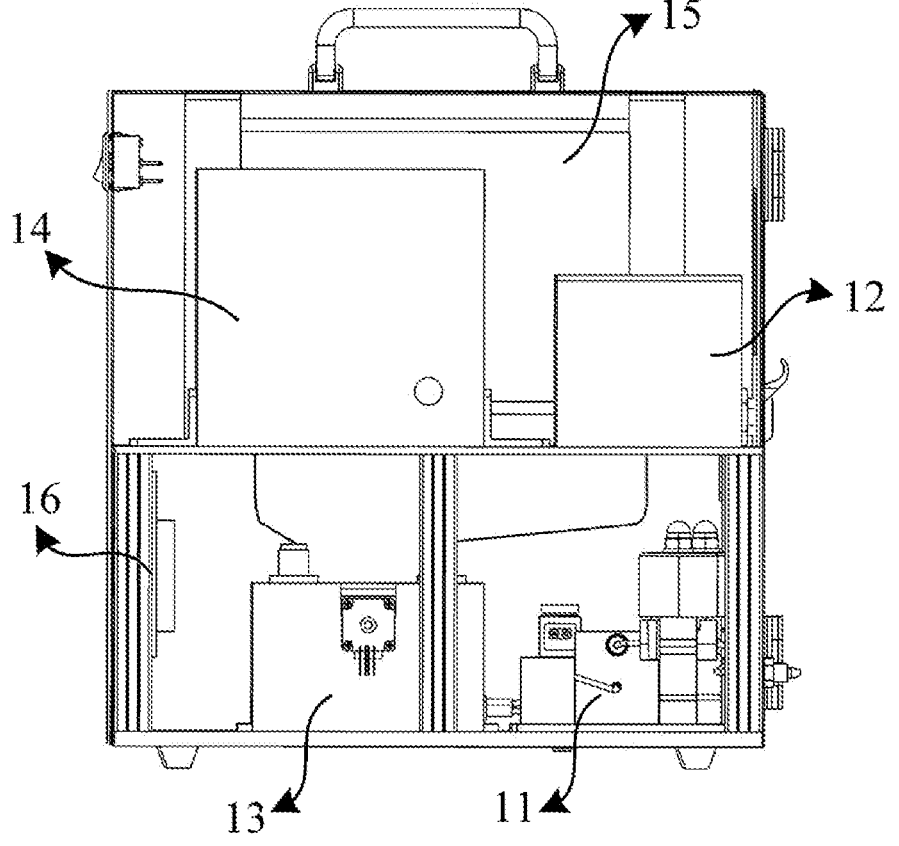
FIG. 3 is a rear view of a fault diagnosis apparatus based on fluorescence multivariate correction analysis of transformer oil according to the present application.
Figure 4:
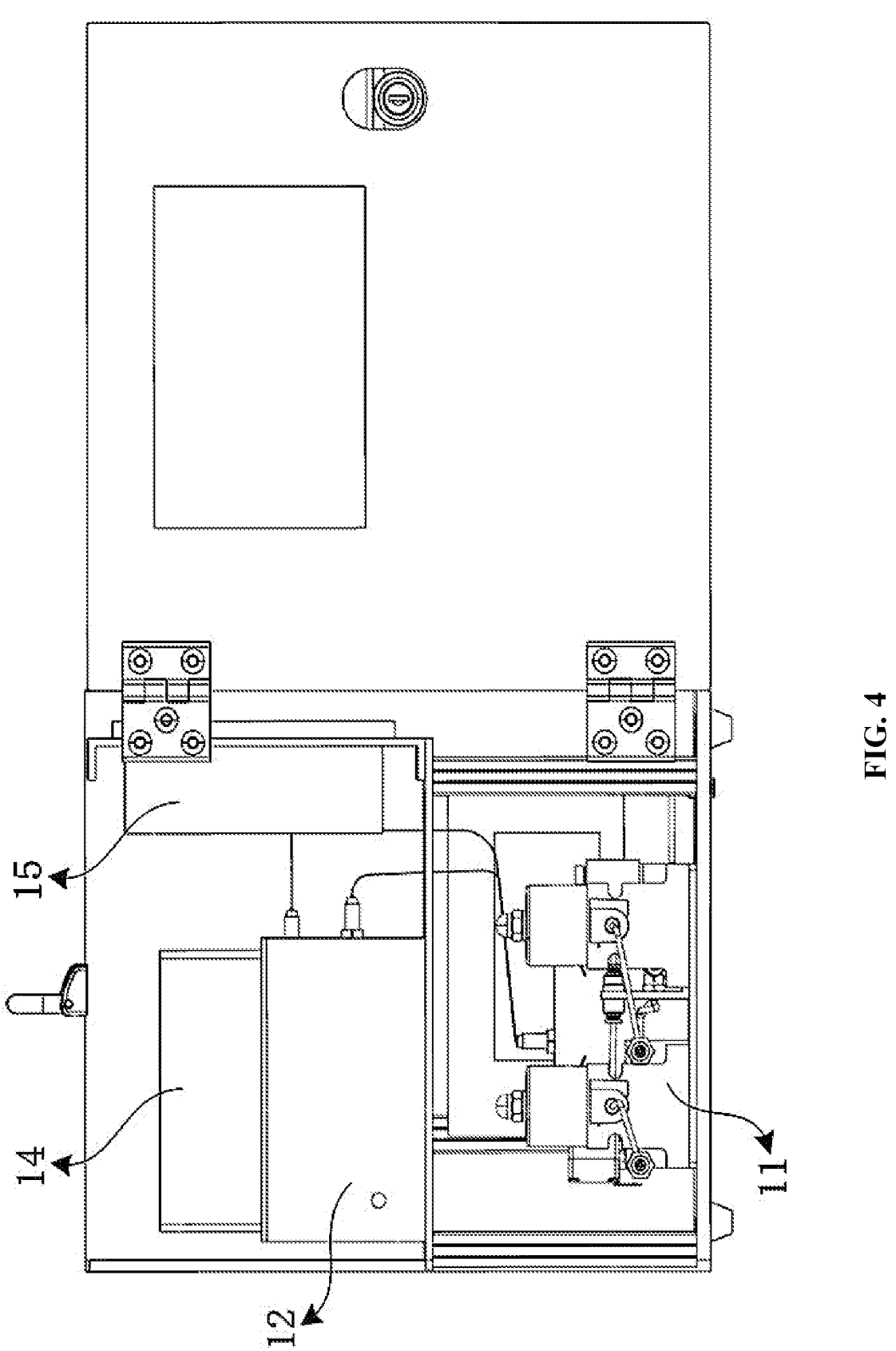
FIG. 4 is a left view of a fault diagnosis apparatus based on fluorescence multivariate correction analysis of transformer oil according to the present application.
Figure 5:
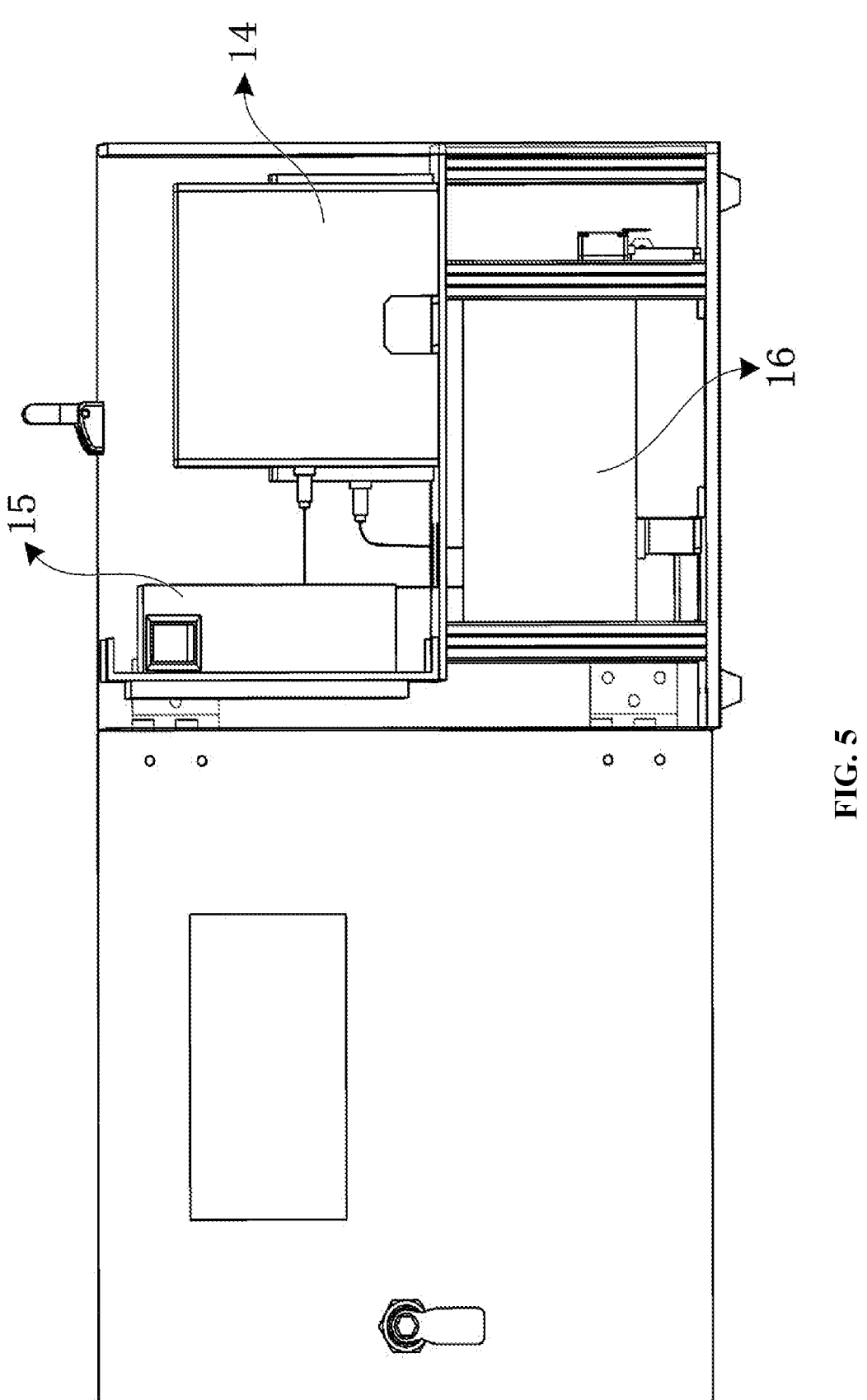
FIG. 5 is a right view of a fault diagnosis apparatus based on fluorescence multivariate correction analysis of transformer oil according to the present application.
Figure 6:
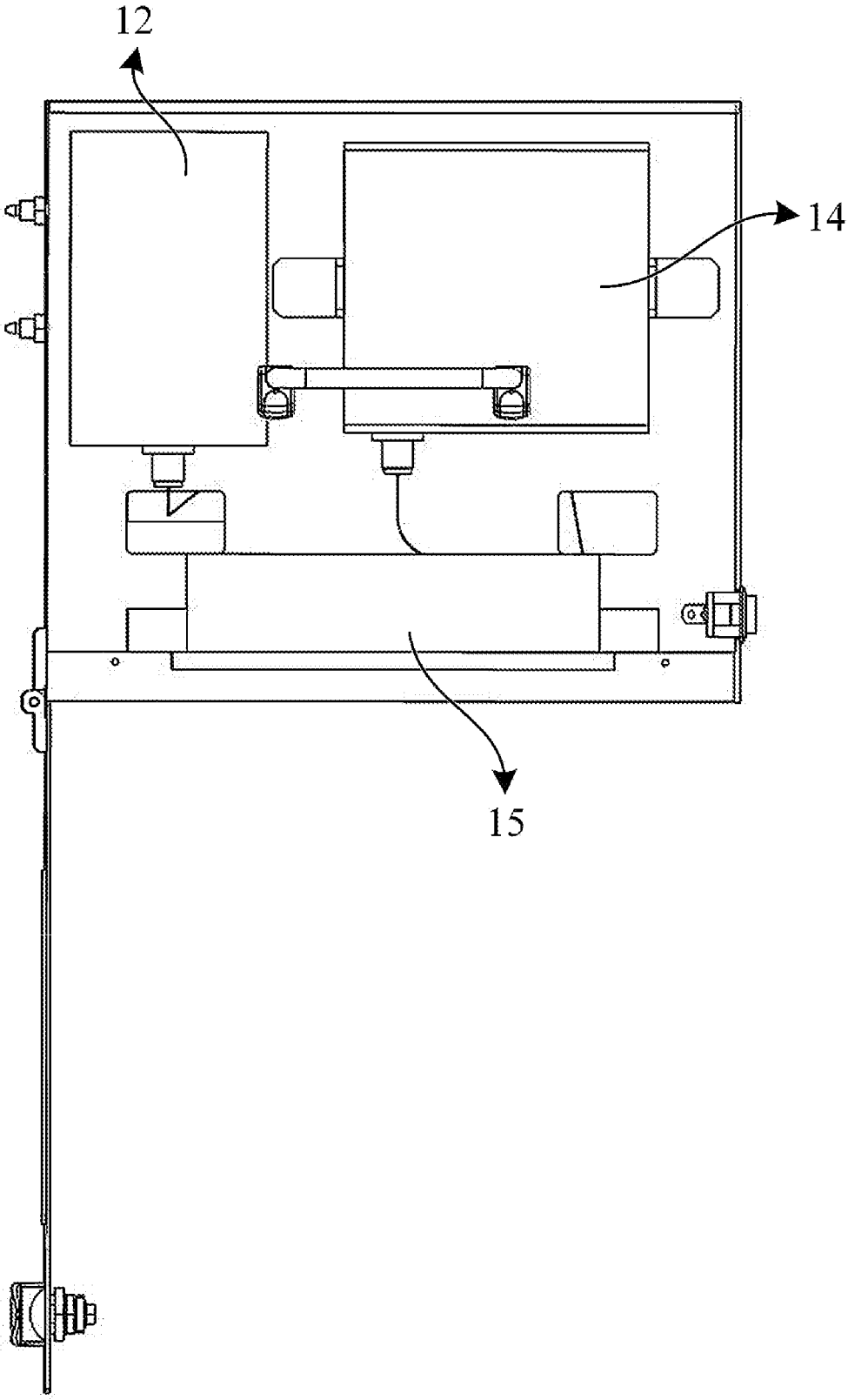
FIG. 6 is a top view of a fault diagnosis apparatus based on fluorescence multivariate correction analysis of transformer oil according to the present application.
Figure 7:
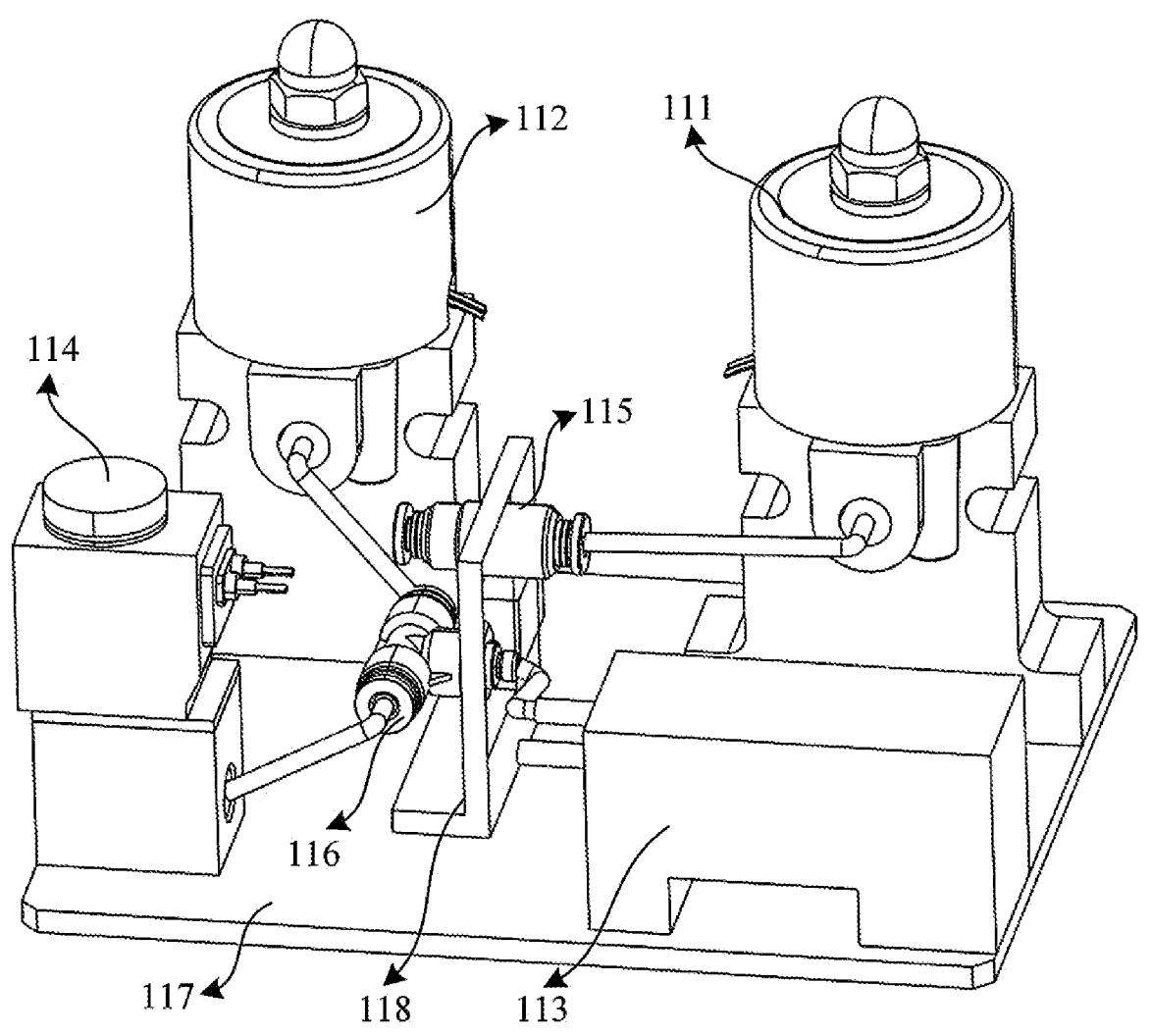
FIG. 7 is a stereo view of an oil extraction apparatus in a fault diagnosis apparatus based on fluorescence multivariate correction analysis of transformer oil according to the present application.
Figure 8:
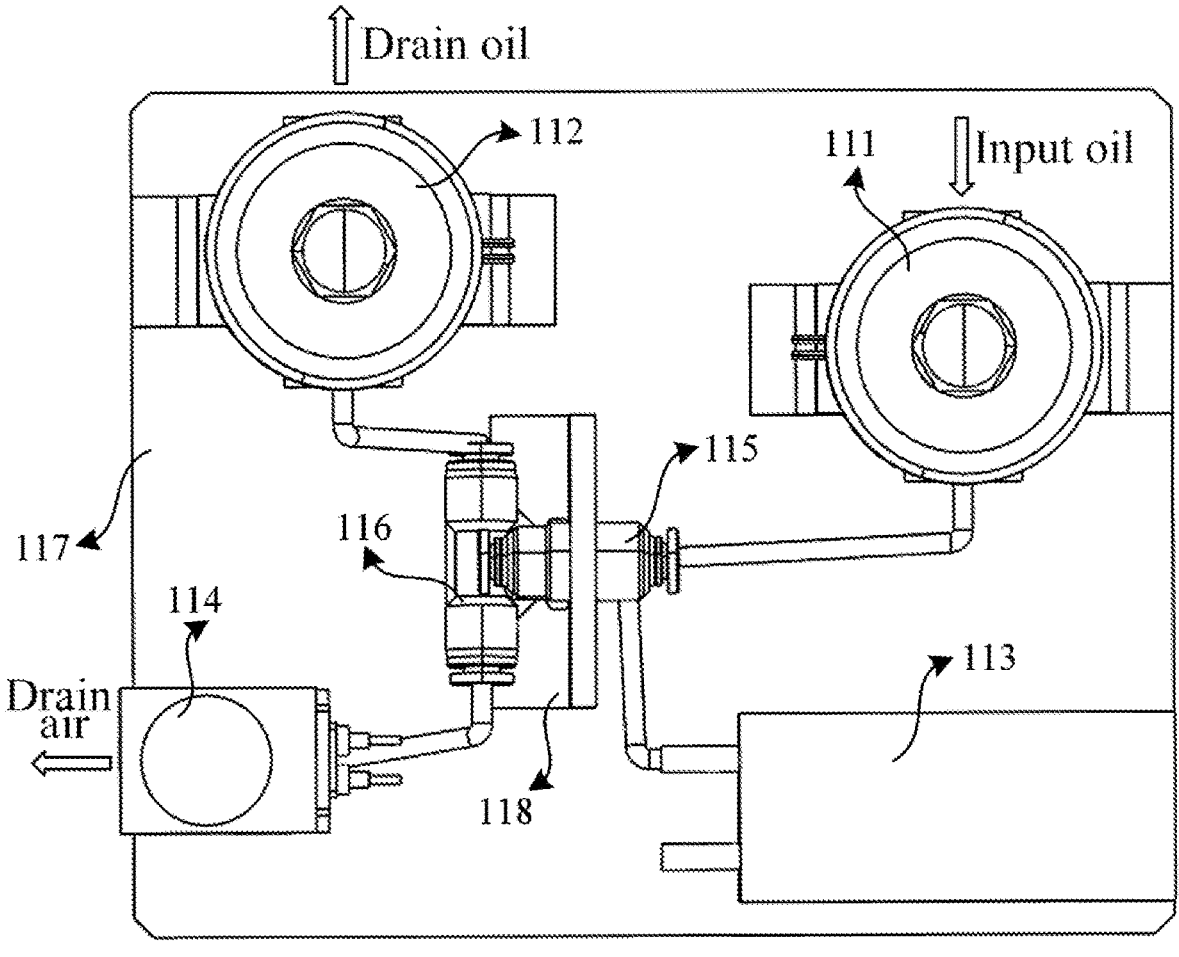
FIG. 8 is a top view of an oil extraction apparatus in a fault diagnosis apparatus based on fluorescence multivariate correction analysis of transformer oil according to the present application.
Figure 9:
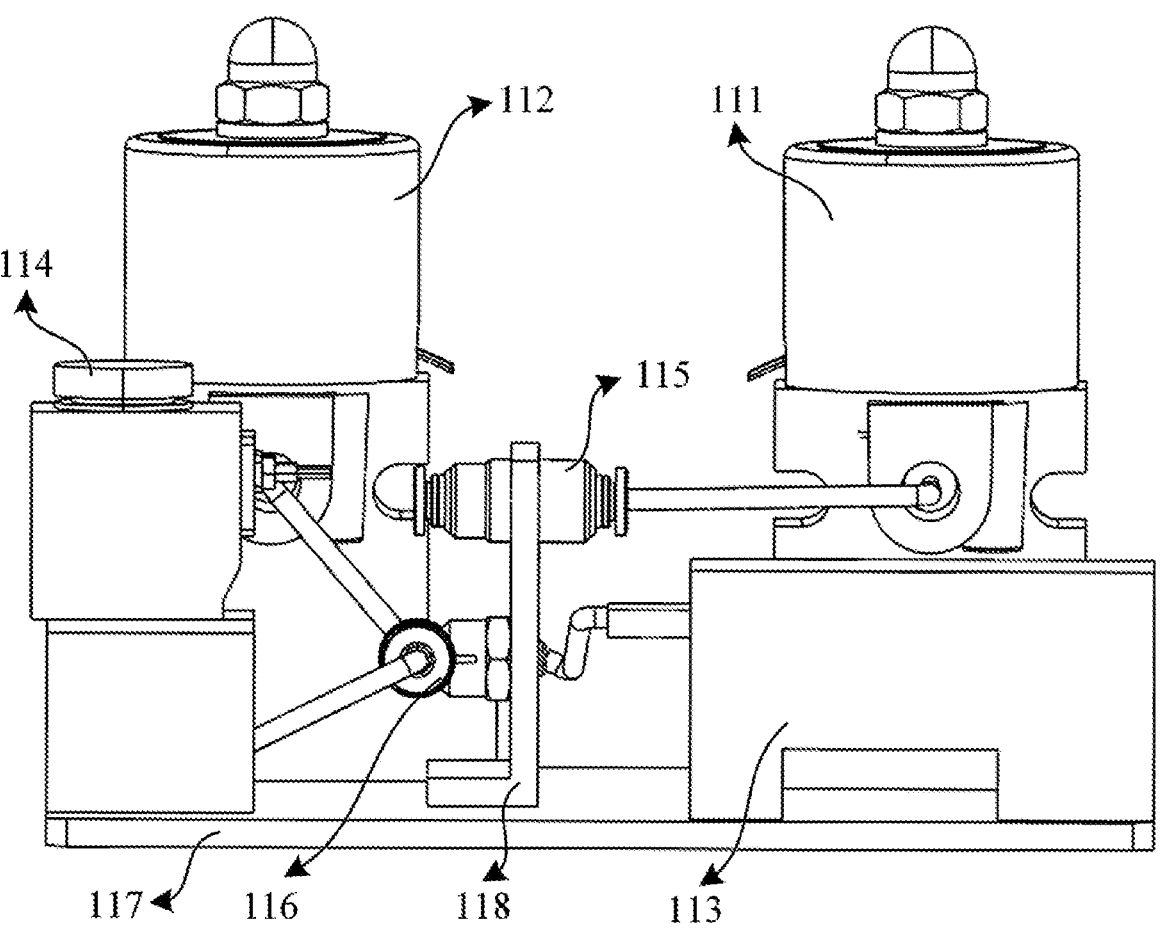
FIG. 9 is a front view of an oil extraction apparatus in a fault diagnosis apparatus based on fluorescence multivariate correction analysis of transformer oil according to the present application.
Figure 10:
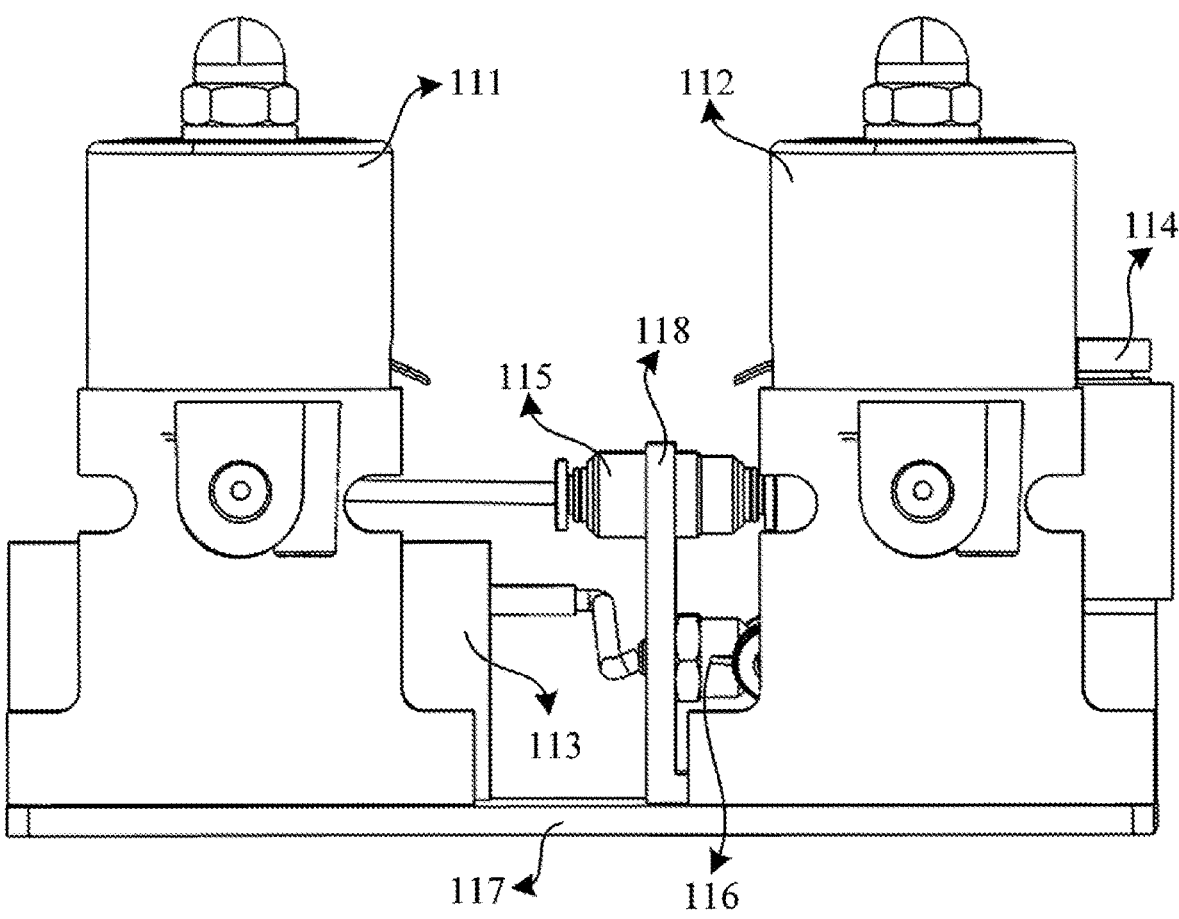
FIG. 10 is a rear view of an oil extraction apparatus in a fault diagnosis apparatus based on fluorescence multivariate correction analysis of transformer oil according to the present application.
Figure 11:
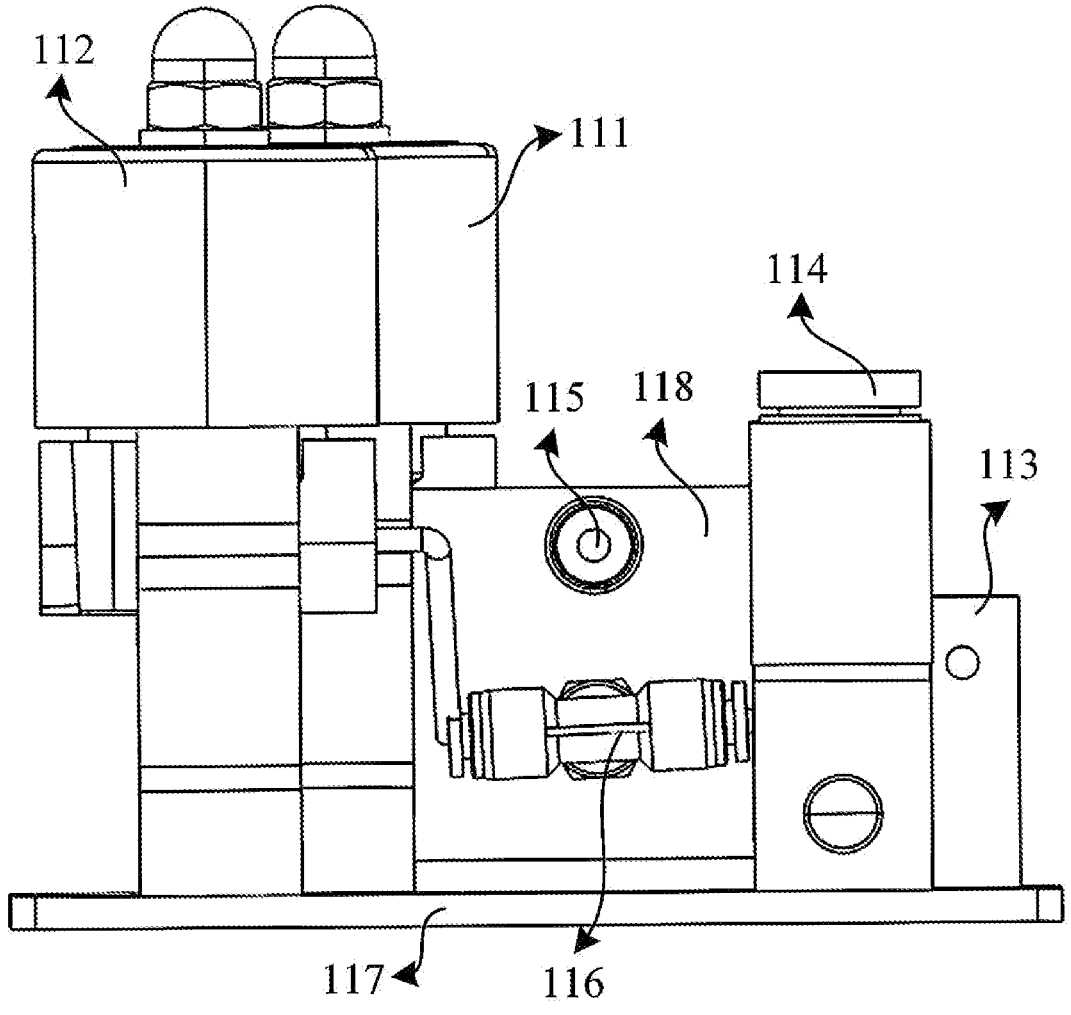
FIG. 11 is a left view of an oil extraction apparatus in a fault diagnosis apparatus based on fluorescence multivariate correction analysis of transformer oil according to the present application.
Figure 12:
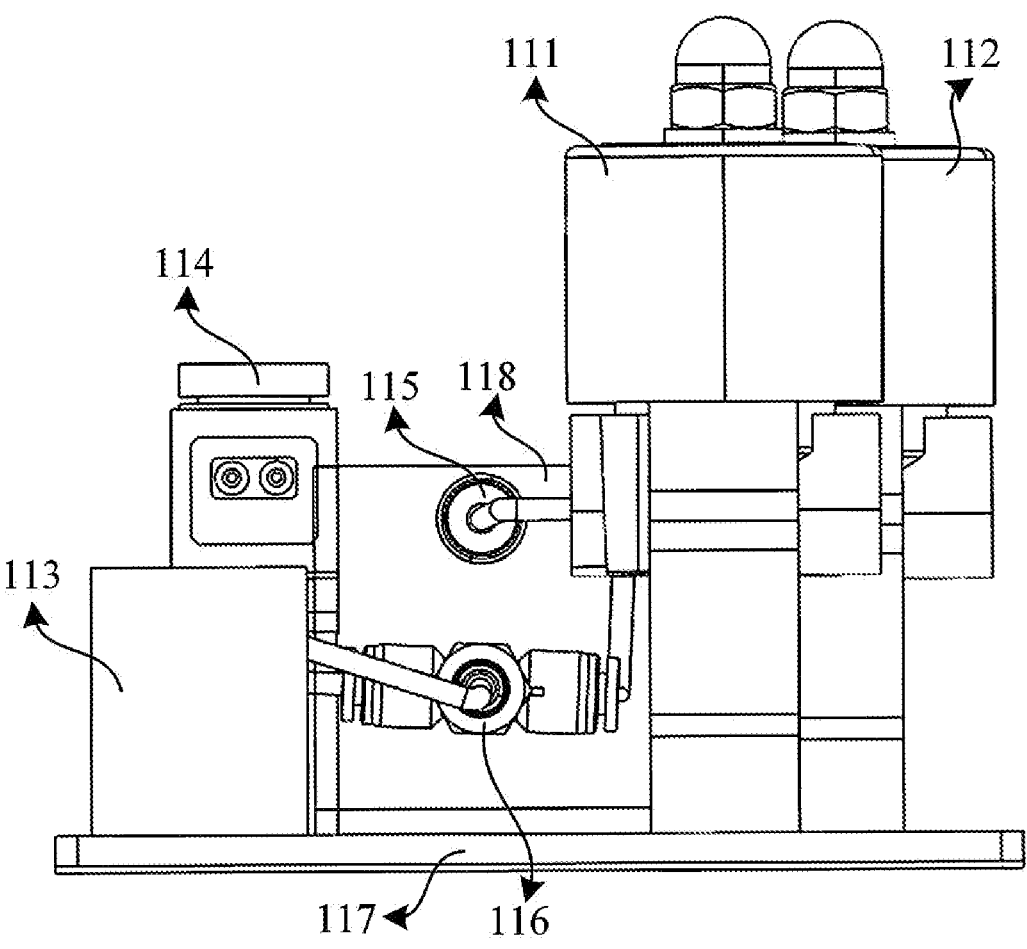
FIG. 12 is a right view of an oil extraction apparatus in a fault diagnosis apparatus based on fluorescence multivariate correction analysis of transformer oil according to the present application.

REFERENCE LIST 10 apparatus housing
11 oil extraction apparatus
12 fluorescence excitation source
13 fluorescence excitation detection apparatus
14 fluorescence signal acquisition and analysis apparatus
15 display screen
111 oil inlet valve
112 oil outlet valve
113 oil extraction pump
114 air pump
115 two-way oil inlet
116 three-way oil and air drain
117 apparatus baseplate
118 mounting bracket
120 fluorescence excitation darkroom
121 monochromatic optimal wavelength light-emitting diode (LED) excitation light source
123 converging lens
125 optical fiber head
122 excitation light source mounting bracket
124 lens mounting bracket
126 first optical fiber interface 1311 detection cell darkroom
1312 detection cell
1313 reference cell
1316 excitation light emission optical fiber probe
1317 fluorescence receiving optical fiber probe
1318 optical fiber head mover
1320 excitation light transmission optical fiber head
1321 fluorescence receiving optical fiber head
1322 excitation light transmission optical fiber interface
1323 fluorescence receiving optical fiber interface
1314 oil inlet pipeline
1315 oil outlet pipeline
1319 stepper motor
140 fluorescence signal acquisition and analysis darkroom
141 fluorescence detector
142 filter wheel
143 multivariate correction filter group
145 second optical fiber head
146 second optical fiber interface
144 filter wheel drive motor
147 fluorescence detector mounting bracket
148 filter wheel drive motor mounting bracket
13181 sliding block
13182 sliding rod

DETAILED DESCRIPTION

Embodiments of the present application are described in conjunction with the drawings of the present application. The embodiments described herein are part, not all, of the embodiments of the present application. Based on the embodiments of the present application, all other embodiments obtained by those skilled in the art without creative work are within the scope of the present application. The present application is described below in conjunction with accompanying drawings and the embodiments.

Embodiment One

As shown in FIGS. 1 to 6, a fault diagnosis apparatus based on fluorescence multivariate correction analysis of transformer oil includes an apparatus housing 10, an oil extraction apparatus 11, a fluorescence excitation source 12, a fluorescence excitation detection apparatus 13, a fluorescence signal acquisition and analysis apparatus 14, and a display screen 15. The inside of the apparatus housing 10 is divided into an upper layer and a lower layer. The upper layer and the lower layer are separated by a partition. The oil extraction apparatus 11 and the fluorescence excitation detection apparatus 13 are disposed on the baseplate of the lower layer. The fluorescence excitation source 12 and the fluorescence signal acquisition and analysis apparatus 14 are disposed on the partition between the upper layer and the lower layer. The display screen 15 is disposed on the front panel of the upper layer.

The oil inlet of the oil extraction apparatus 11 is connected to the oil outlet of an external transformer oil tank through a pipe in a sealed manner. The oil drain of the oil extraction apparatus 11 is connected to the oil inlet of the external transformer oil tank through a pipe in a sealed manner. An end of the two-way oil inlet 115 of the oil extraction apparatus 11 is connected to the oil inlet of the fluorescence excitation detection apparatus 13 in a sealed manner. The first optical fiber interface 126 of the fluorescence excitation source 12 is connected to the excitation light transmission optical fiber interface 1322 of the fluorescence excitation detection apparatus 13 through an optical fiber. The fluorescence receiving optical fiber interface 1323 of the fluorescence excitation detection apparatus 13 is connected to the second optical fiber interface 146 of the fluorescence signal acquisition and analysis apparatus 14 through an optical fiber.

The oil extraction apparatus 11 is configured to input the transformer oil in the transformer oil tank into the fluorescence excitation detection apparatus 13 by means of the pressure difference between the transformer oil tank and the evacuated fluorescence excitation detection apparatus 13. The monochromatic excitation light generated by the fluorescent excitation source 12 is used for exciting the transformer oil in the fluorescence excitation detection apparatus 13 to generate fluorescence. The fluorescence excitation detection apparatus 13 generates the fluorescence according to the input monochromatic excitation light and inputs the fluorescence to the fluorescence signal acquisition and analysis apparatus 14. The fluorescence signal acquisition and analysis apparatus 14 acquires a fluorescence signal emitted by the transformer oil by using a multivariate correction filter group 143 and analyzes the type of a transformer failure. The display screen 15 is configured to display the result acquired and analyzed by the fluorescence signal acquisition and analysis apparatus 14.

As shown in FIGS. 7 to 12, the oil extraction apparatus 11 includes an oil inlet valve 111, an oil outlet valve 112, an oil extraction pump 113, an air pump 114, a two-way oil inlet 115, a three-way oil and air drain 116, an apparatus baseplate 117, and a mounting bracket 118. The oil inlet valve 111, the oil outlet valve 112, the oil extraction pump 113, and the air pump 114 are all fixedly mounted on the apparatus baseplate 117. The two-way oil inlet 115 and the three-way oil and air drain 116 are fixedly mounted on the mounting bracket 118. The mounting bracket 118 is fixedly mounted on the apparatus baseplate 117.

A first end of the oil inlet valve 111 is connected to the oil outlet of the transformer oil tank through a pipe in a sealed manner. A second end of the oil inlet valve 111 is connected to a first end of the two-way oil inlet 115 through a pipe in a sealed manner. A second end of the two-way oil inlet 115 is connected to the oil inlet of the detection cell 1312 of the fluorescence excitation detection apparatus 13 through a pipe in a sealed manner. A first end of the oil extraction pump 113 is connected to a first port of the three-way oil and air drain 116 through a pipe in a sealed manner. A second end of the oil extraction pump 113 is connected to the oil outlet of the detection cell 1312 of the fluorescence excitation detection apparatus 13 through a pipe in a sealed manner. A second port of the three-way oil and air drain 116 is connected to a first end of the oil outlet valve 112 in a sealed manner. A second end of the oil outlet valve 112 is connected to the oil inlet of the transformer oil tank through a pipe in a sealed manner. A third port of the three-way oil and air drain 116 is connected to an end of the air pump 114 through a pipe in a sealed manner. The oil extraction pump 113 is configured to extract the detected transformer insulating oil (that is, the transformer oil) from the detection cell 1312 of the fluorescence excitation detection apparatus 13. The air pump 114 is configured to extract impurity gas in the internal pipeline of the oil extraction apparatus 11 and impurity gas in the detection cell 1312 of the fluorescence excitation detection apparatus 13.

Figure 13:
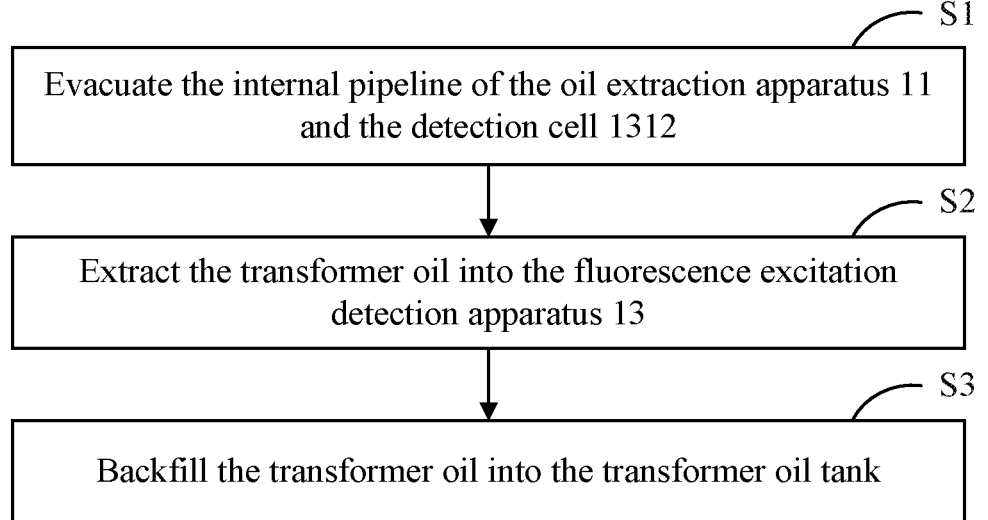
FIG. 13 is a working flowchart of an oil extraction apparatus in a fault diagnosis apparatus based on fluorescence multivariate correction analysis of transformer oil according to the present application.

As shown in FIG. 13, the working process of the oil extraction apparatus 11 is as follows:

In S1, the internal pipeline of the oil extraction apparatus 11 and the detection cell 1312 are evacuated.

The oil inlet valve 111 and the oil outlet valve 112 are closed. The oil extraction pump 113 is set in a normally-on mode. The air pump 114 is started to evacuate the internal pipeline of the oil extraction apparatus 11 and the fluorescence excitation detection apparatus 13. The oil extraction pump 113 is configured to be in a blocking mode and close the air pump 114 after evacuation is completed.

In S2, the transformer oil is extracted into the fluorescence excitation detection apparatus 13.

The oil inlet valve 111 is opened. The transformer oil in the transformer oil tank is extracted into the fluorescence excitation detection apparatus 13 by means of the pressure difference between the oil outlet of the transformer oil tank and the evacuated fluorescence excitation detection apparatus 13. The oil inlet valve 111 is closed after the oil input is completed.

In S3, the transformer oil is backfilled into the transformer oil tank.

The oil outlet valve 112 is opened after the detection is completed. The air pump 114 is set in a blocking mode. The oil extraction pump 113 is started to extract the transformer oil from the fluorescence excitation detection apparatus 13, and the transformer oil is pressed back to the transformer oil tank.

Figure 14:
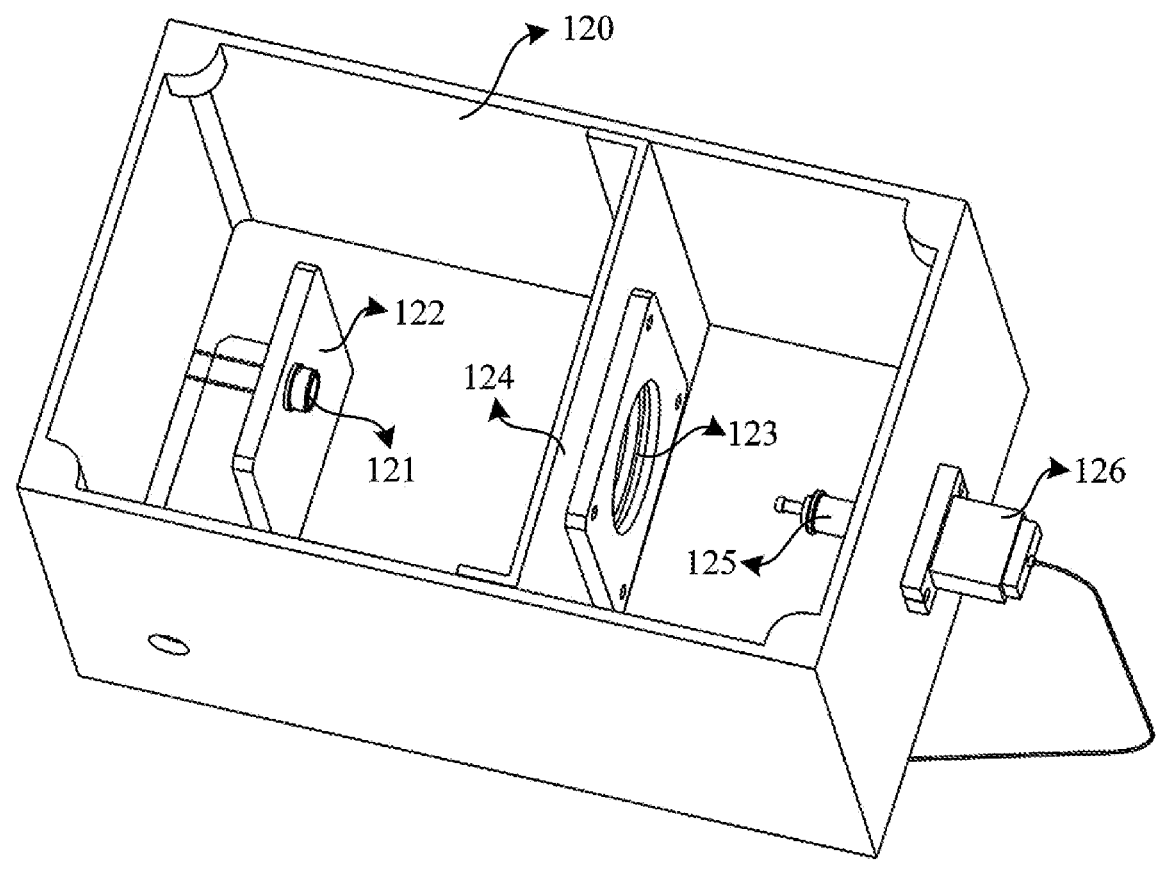
FIG. 14 is a first three-dimensional view of a fluorescence excitation source in a fault diagnosis apparatus based on fluorescence multivariate correction analysis of transformer oil according to the present application.
Figure 15:
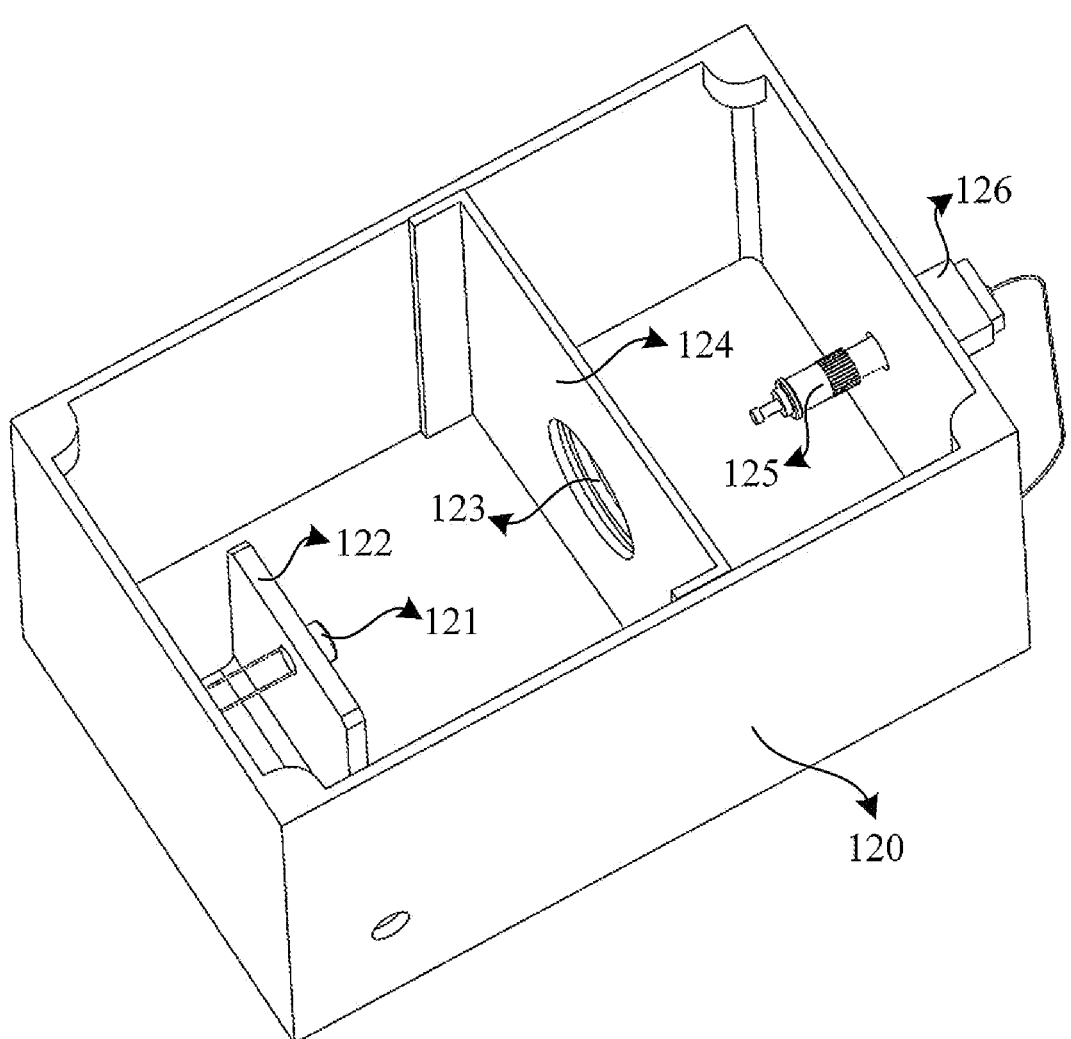
FIG. 15 is a second three-dimensional view of a fluorescence excitation source in a fault diagnosis apparatus based on fluorescence multivariate correction analysis of transformer oil according to the present application.
Figure 16:
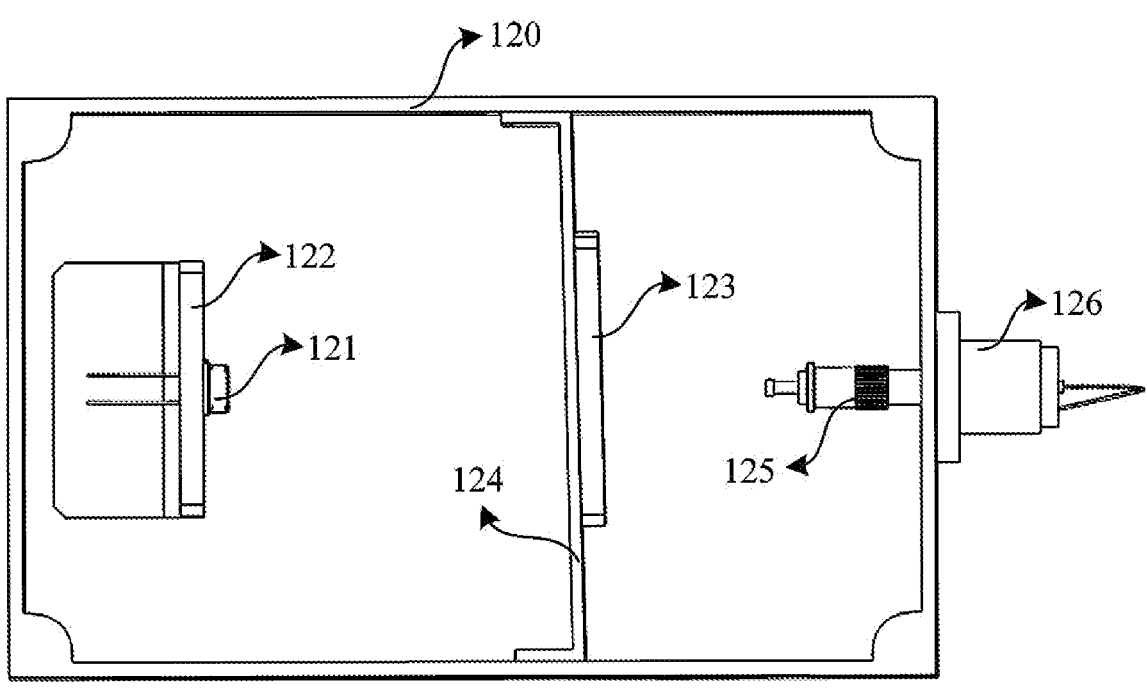
FIG. 16 is a top view of a fluorescence excitation source in a fault diagnosis apparatus based on fluorescence multivariate correction analysis of transformer oil according to the present application.

As shown in FIGS. 14 to 16, the fluorescence excitation source 12 includes a fluorescence excitation darkroom 120, a monochromatic optimal wavelength LED excitation light source 121, an excitation light source mounting bracket 122, a converging lens 123, a lens mounting bracket 124, an optical fiber head 125, and a first optical fiber interface 126. The excitation light source mounting bracket 122 is fixedly disposed on the left end of the internal baseplate of the fluorescence excitation darkroom 120. The monochromatic optimal wavelength LED excitation light source 121 is mounted on the excitation light source mounting bracket 122. The lens mounting bracket 124 is fixedly disposed at the middle position inside the fluorescence excitation darkroom 120. The converging lens 123 is embedded in the lens mounting bracket 124. The optical fiber head 125 is fixedly disposed on the internal right sidewall of the fluorescence excitation darkroom 120. The first optical fiber interface 126 is fixedly disposed on the right sidewall outside the fluorescence excitation darkroom 120. The optical fiber head 125 is cooperatively connected to the first optical fiber interface 126. The centerline of the monochromatic optimal wavelength LED excitation light source 121, the centerline of the converging lens 123, and the centerline of the first optical fiber interface 126 are in one straight line.

The inner wall of the fluorescence excitation darkroom 120 is coated with a light-absorbing coating to prevent external interference ambient light from entering and eliminate the effect of internal multi-reflected light. The monochromatic optimal wavelength LED excitation light source 121 emits monochromatic ultraviolet light for exciting the transformer oil. The converging lens 123 adopts a convex lens and is configured to converge the monochromatic ultraviolet light emitted by the monochromatic optimal wavelength LED excitation light source 121 onto the optical fiber head 125. The optical fiber head 125 is configured to acquire the monochrome ultraviolet light emitted by the monochromatic optimal wavelength LED excitation light source 121. The first optical fiber interface 126 adopts a straight tip-standard connector (ST-SC) standard optical fiber interface and is configured to export the monochromatic ultraviolet light emitted by the monochromatic optimal wavelength LED excitation light source 121.

The working process of the fluorescence excitation source 12 includes the following:

The monochromatic optimal wavelength LED excitation light source 121 emits monochromatic excitation light. The excitation light is converged onto the optical fiber head 125 through the converging lens 123. The optical fiber head 125 is configured to collect the excitation light and transmit the excitation light through the first optical fiber interface 126 for exciting the transformer oil to generate fluorescence.

Figure 17:
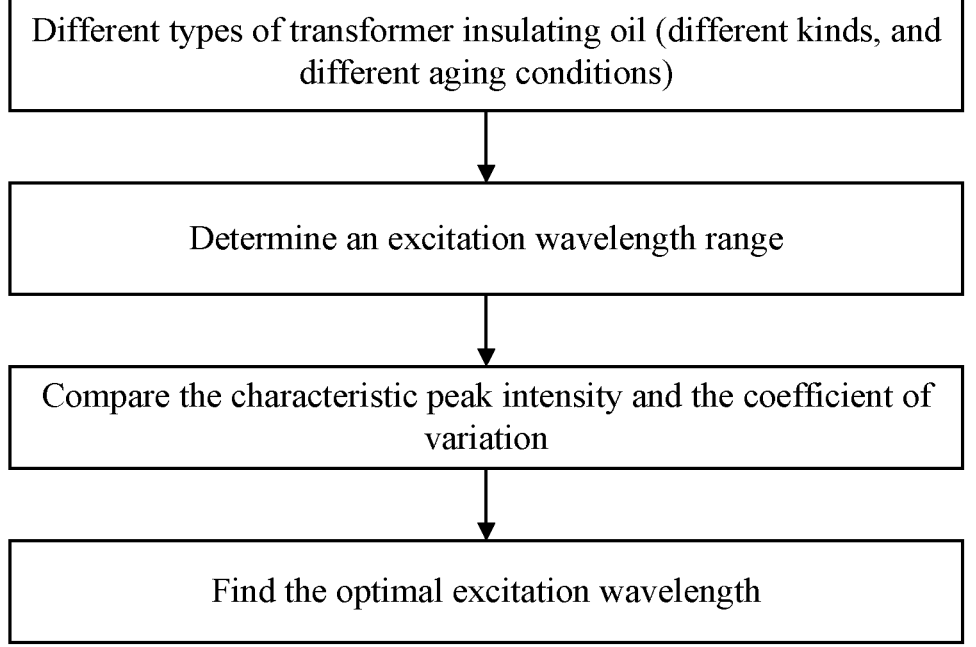
FIG. 17 is a flowchart of a method for selecting an optimal excitation wavelength by a fluorescence excitation source in a fault diagnosis apparatus based on fluorescence multivariate correction analysis of transformer oil according to the present application.
Figure 18:
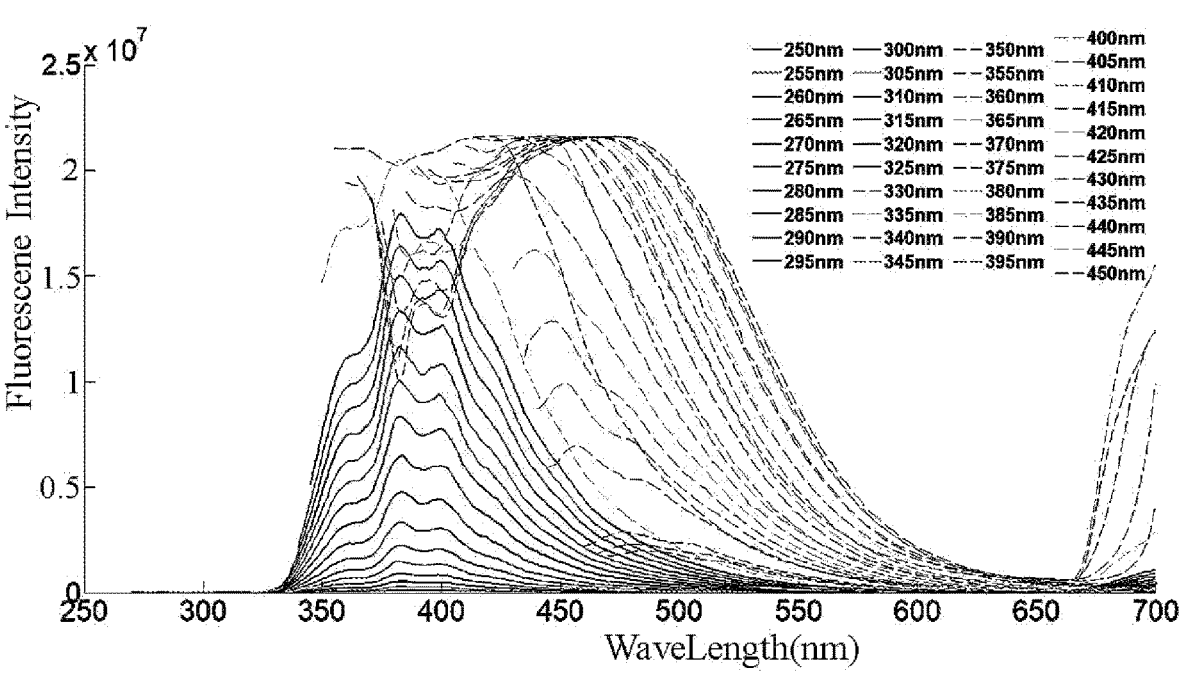
FIG. 18 is an excitation wavelength scanning fluorescence spectrum of a new oil sample according to the present application.

As shown in FIG. 17, the method for selecting the optimal excitation wavelength by the monochromatic optimal wavelength LED excitation light source 121 includes the following:

Firstly, three-dimensional fluorescence spectrum data of different types of transformer oil are acquired. As shown in FIG. 18, the excitation wavelength scanning fluorescence spectrum of a new oil sample shows that the fluorescence characteristic value of the fluorescence spectrum of the transformer oil is distributed in the wavelength range of 350 nm to 500 nm. In this range, the fluorescence spectrum can significantly display the characteristics of the sample, that is, the characteristic peak is clearly distinguishable and regular. The excitation wavelength is in a range of 270 nm to 310 nm.

Secondly, the excitation wavelength is used as the abscissa, and the peak intensity is used as the ordinate to compare the peak intensity of the sample characteristics at different excitation wavelengths. Then, the excitation wavelength is used as the abscissa, and the coefficient of variation is used as the ordinate to compare the dispersion degree of the sample characteristics at different excitation wavelengths. The calculation formula of the coefficient of variation is as follows:

$$c_v = \frac{\delta}{\mu} \cdot c_v$$

denotes the sample coefficient of variation of fluorescence spectrum data of an oil sample at different fault time under excitation wavelength v. $\delta$ denotes a sample standard deviation. $\mu$ denotes a sample average. The larger the coefficient of variation is, the larger the dispersion degree is. The optimal excitation wavelength should satisfy the fact that the peak intensity and the coefficient of variation are maximized so that it can be determined which excitation wavelength has the best fault discrimination effect.

Figure 19:
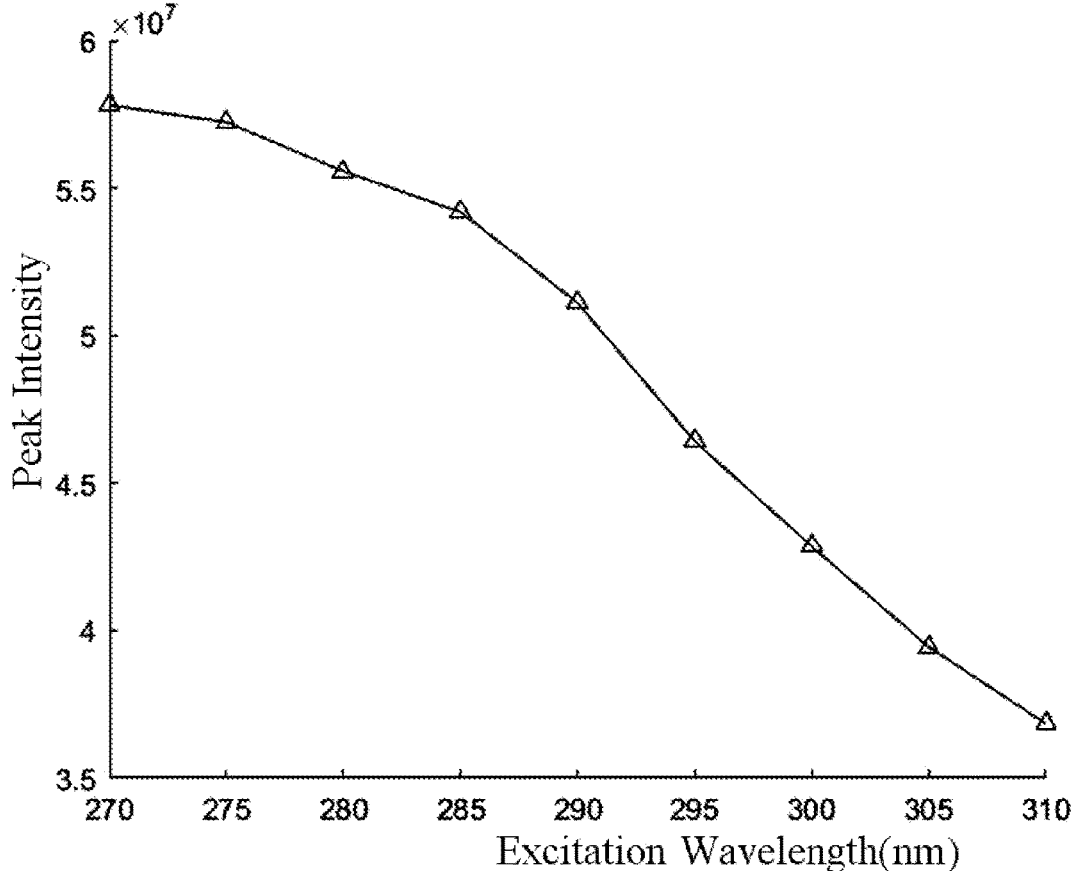
FIG. 19 is a graph illustrating a relationship between the peak intensity and different excitation wavelengths when the optimal excitation wavelength of Karamay oil is determined according to the present application.
Figure 20:
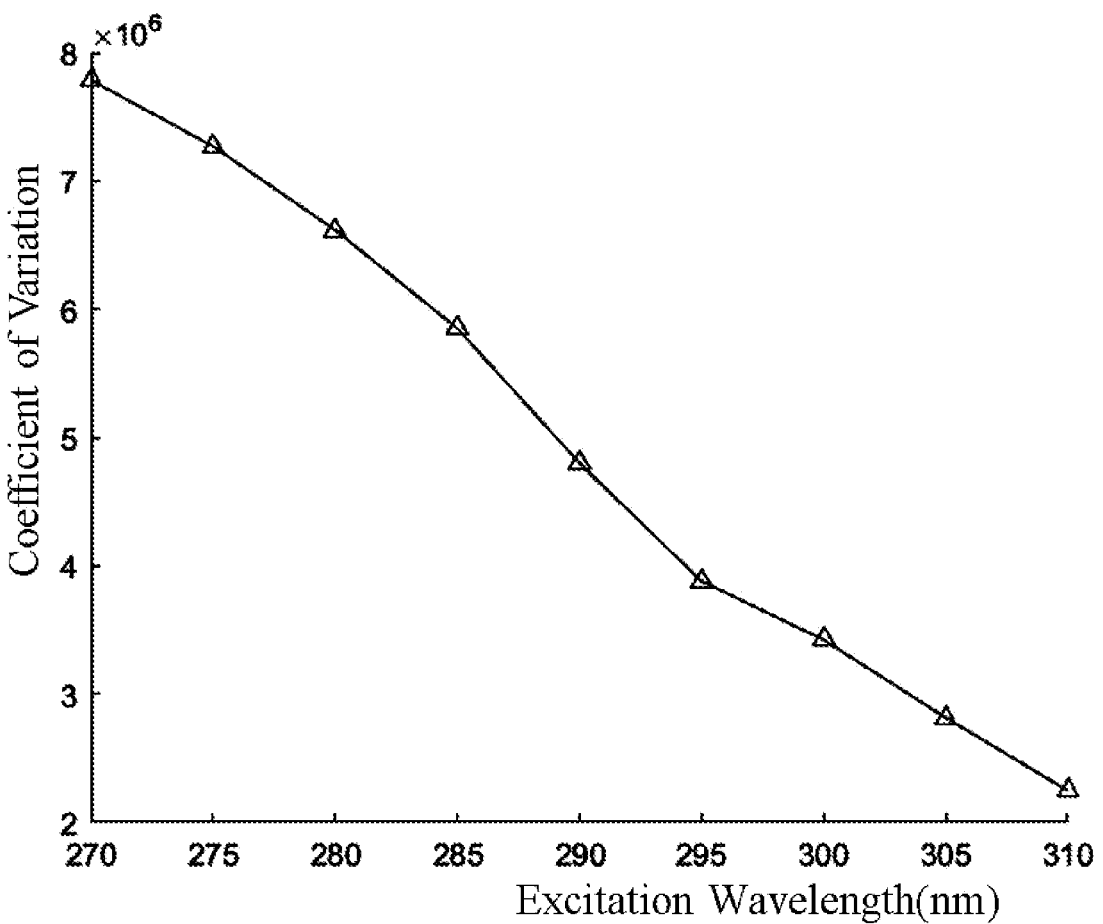
FIG. 20 is a graph illustrating a relationship between a coefficient of variation and different excitation wavelengths when the optimal excitation wavelength of Karamay oil is determined according to the present application.
Figure 21:
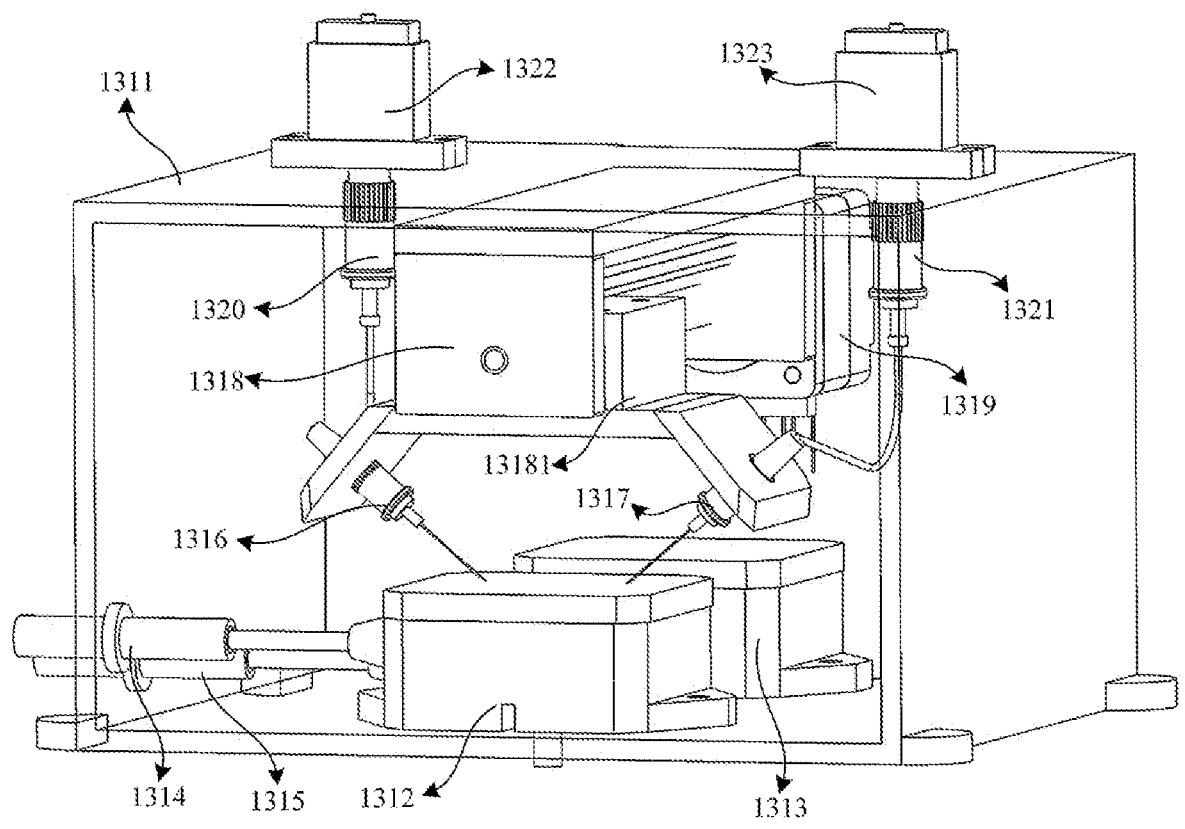
FIG. 21 is a stereo view of a fluorescence excitation detection apparatus in a fault diagnosis apparatus based on fluorescence multivariate correction analysis of transformer oil according to the present application.
Figure 22:
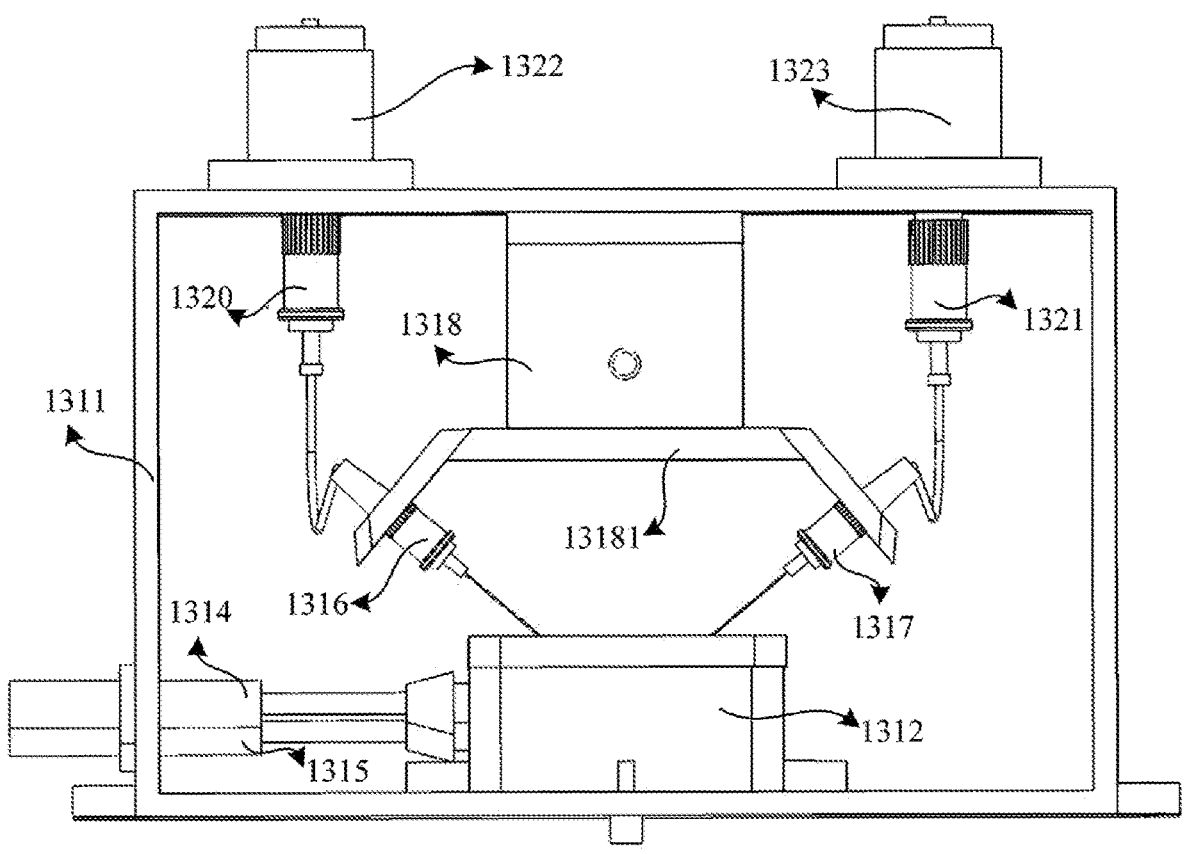
FIG. 22 is a front view of a fluorescence excitation detection apparatus in a fault diagnosis apparatus based on fluorescence multivariate correction analysis of transformer oil according to the present application.
Figure 23:
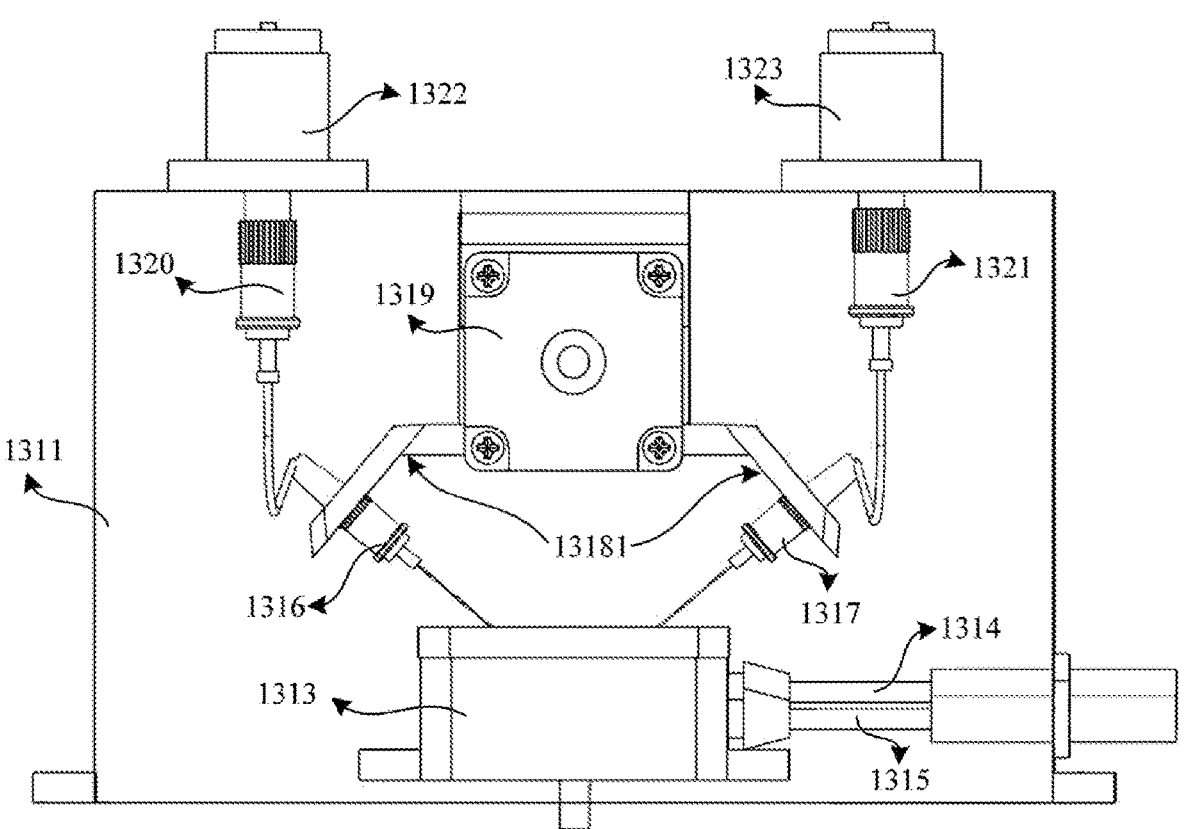
FIG. 23 is a rear view of a fluorescence excitation detection apparatus in a fault diagnosis apparatus based on fluorescence multivariate correction analysis of transformer oil according to the present application.
Figure 24:
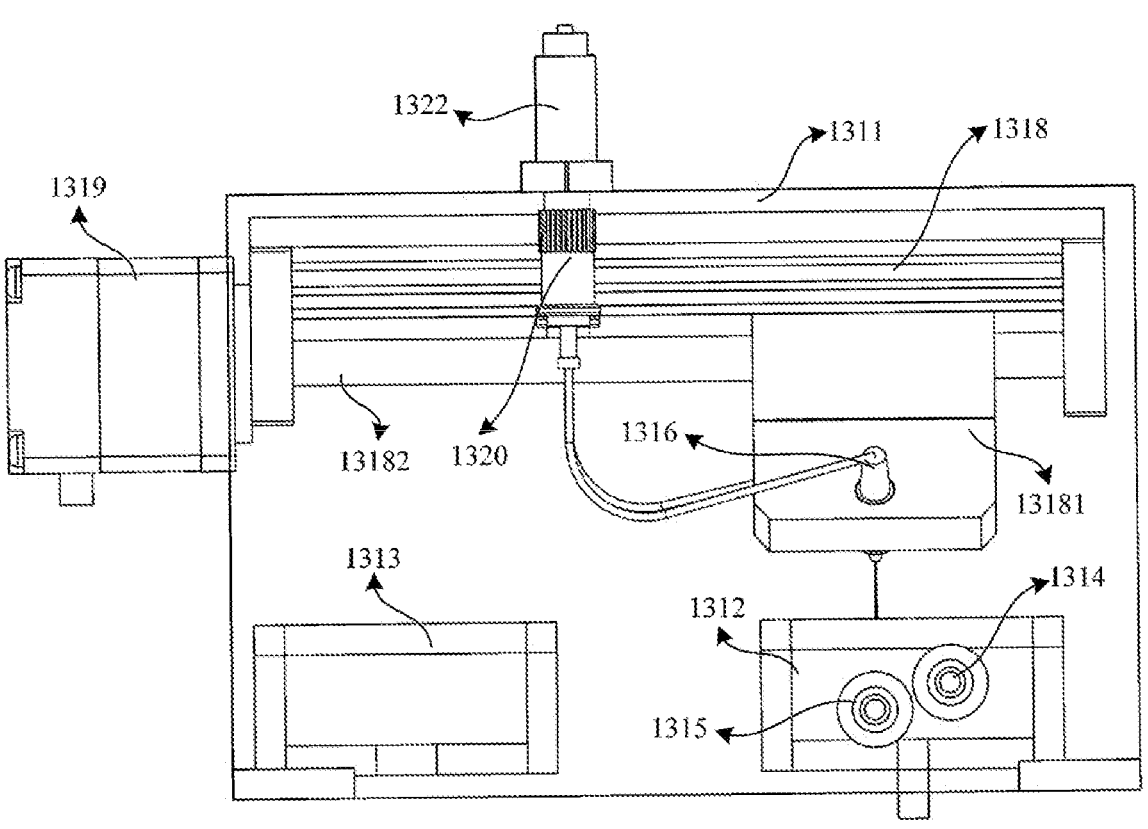
FIG. 24 is a left view of a fluorescence excitation detection apparatus in a fault diagnosis apparatus based on fluorescence multivariate correction analysis of transformer oil according to the present application.
Figure 25:
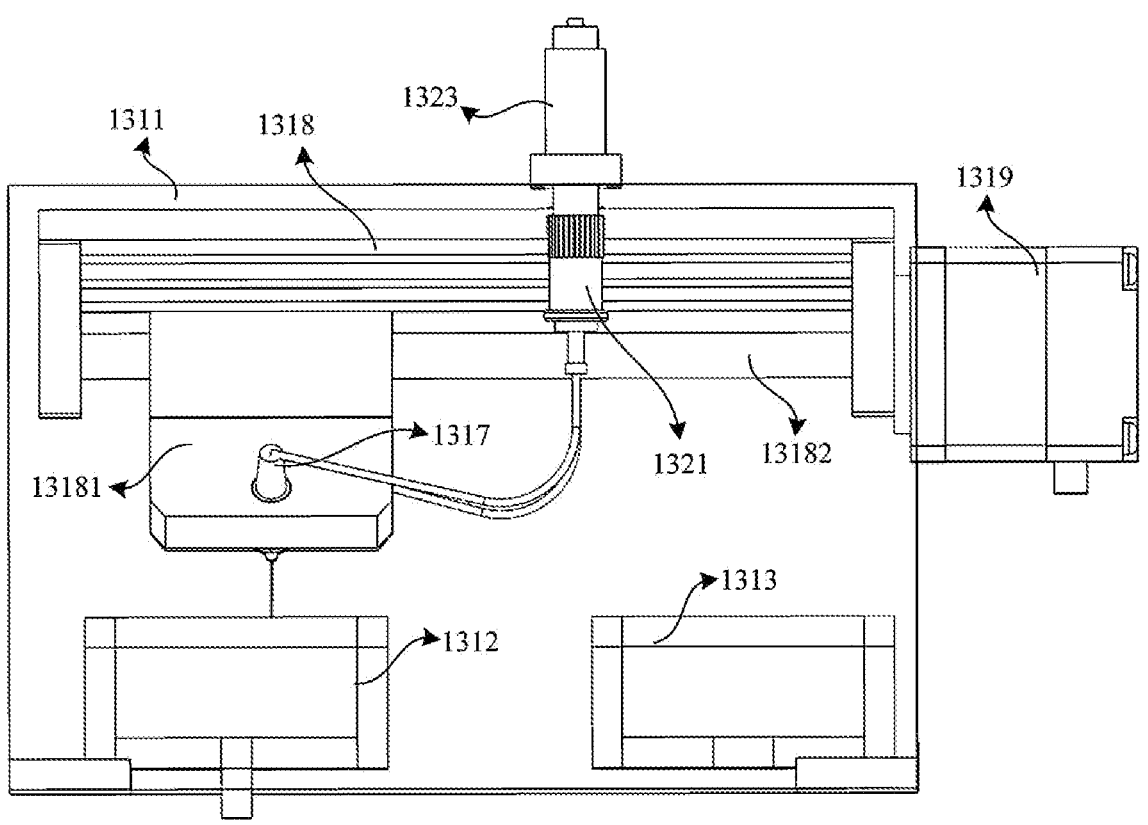
FIG. 25 is a right view of a fluorescence excitation detection apparatus in a fault diagnosis apparatus based on fluorescence multivariate correction analysis of transformer oil according to the present application.
Figure 26:
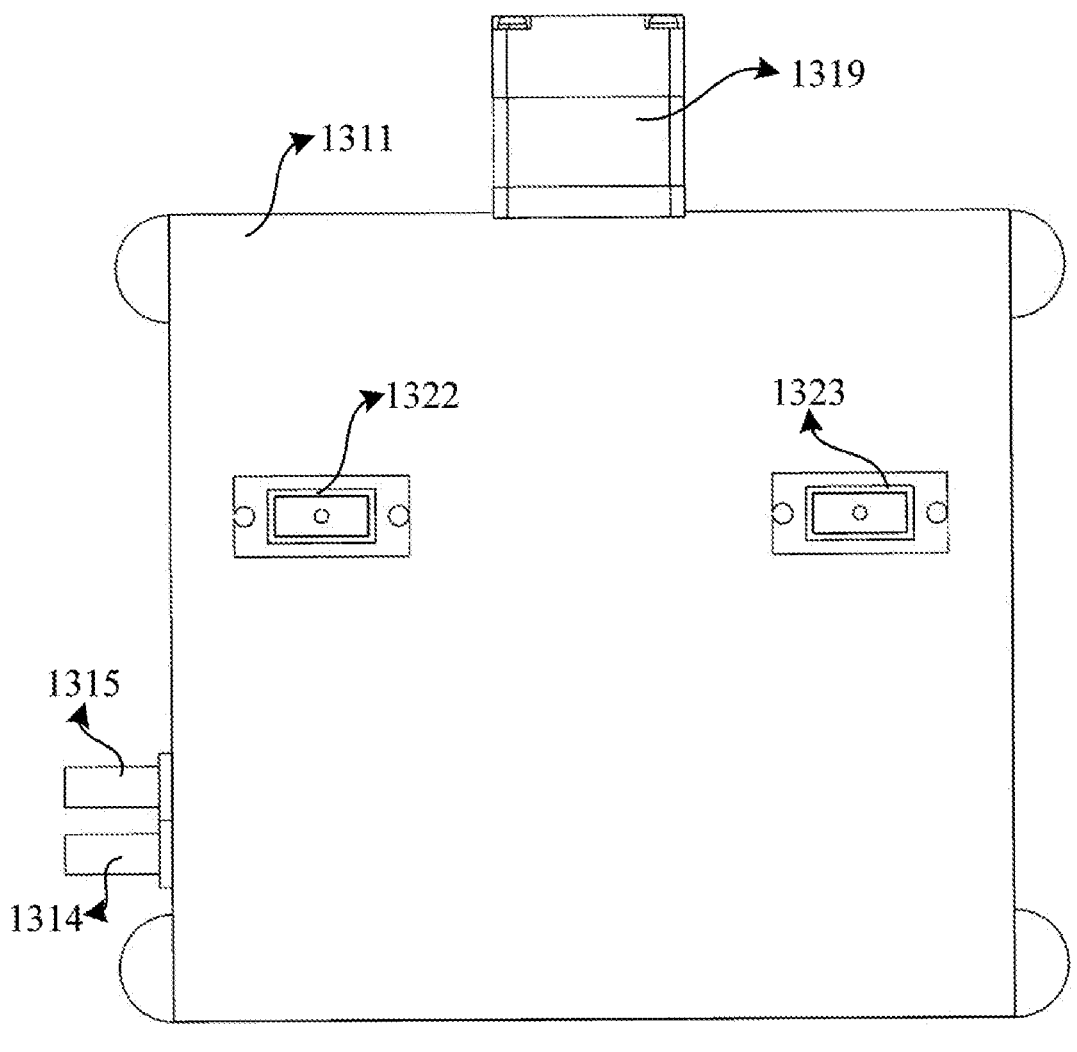
FIG. 26 is a top view of a fluorescence excitation detection apparatus in a fault diagnosis apparatus based on fluorescence multivariate correction analysis of transformer oil according to the present application.
Figure 27:
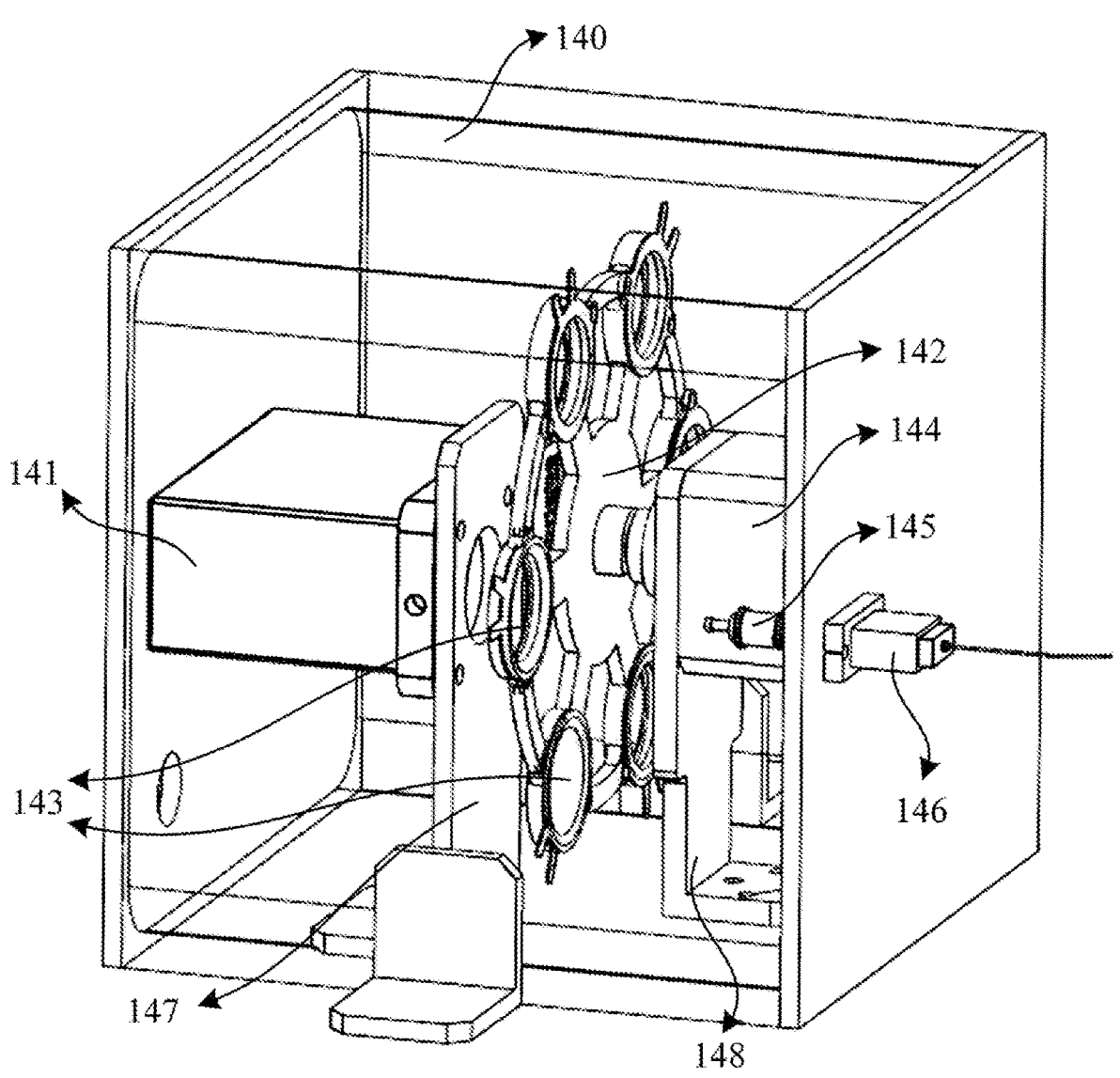
FIG. 27 is a stereo view of a fluorescence signal acquisition and analysis apparatus in a fault diagnosis apparatus based on fluorescence multivariate correction analysis of transformer oil according to the present application.
Figure 28:
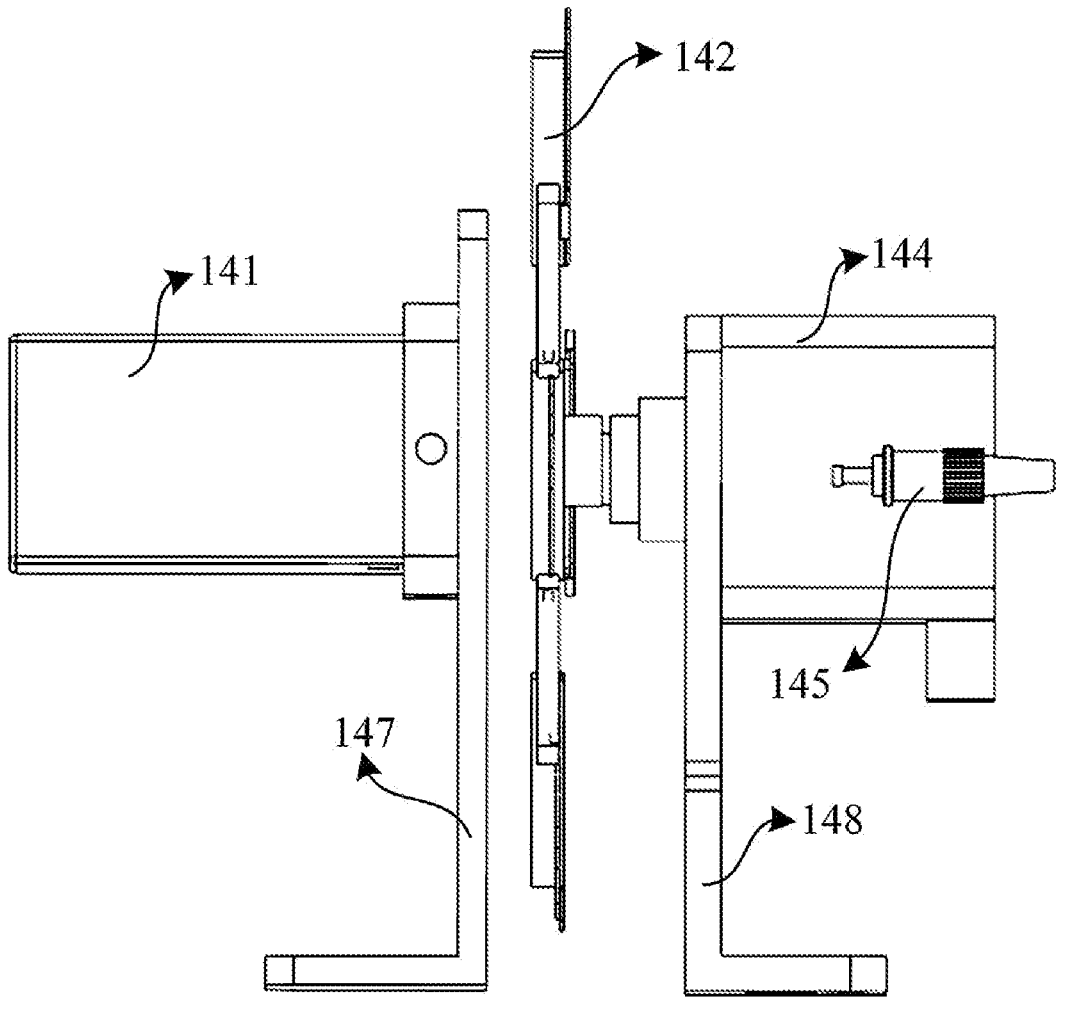
FIG. 28 is a front view of a fluorescence signal acquisition and analysis apparatus in a fault diagnosis apparatus based on fluorescence multivariate correction analysis of transformer oil according to the present application.
Figure 29:
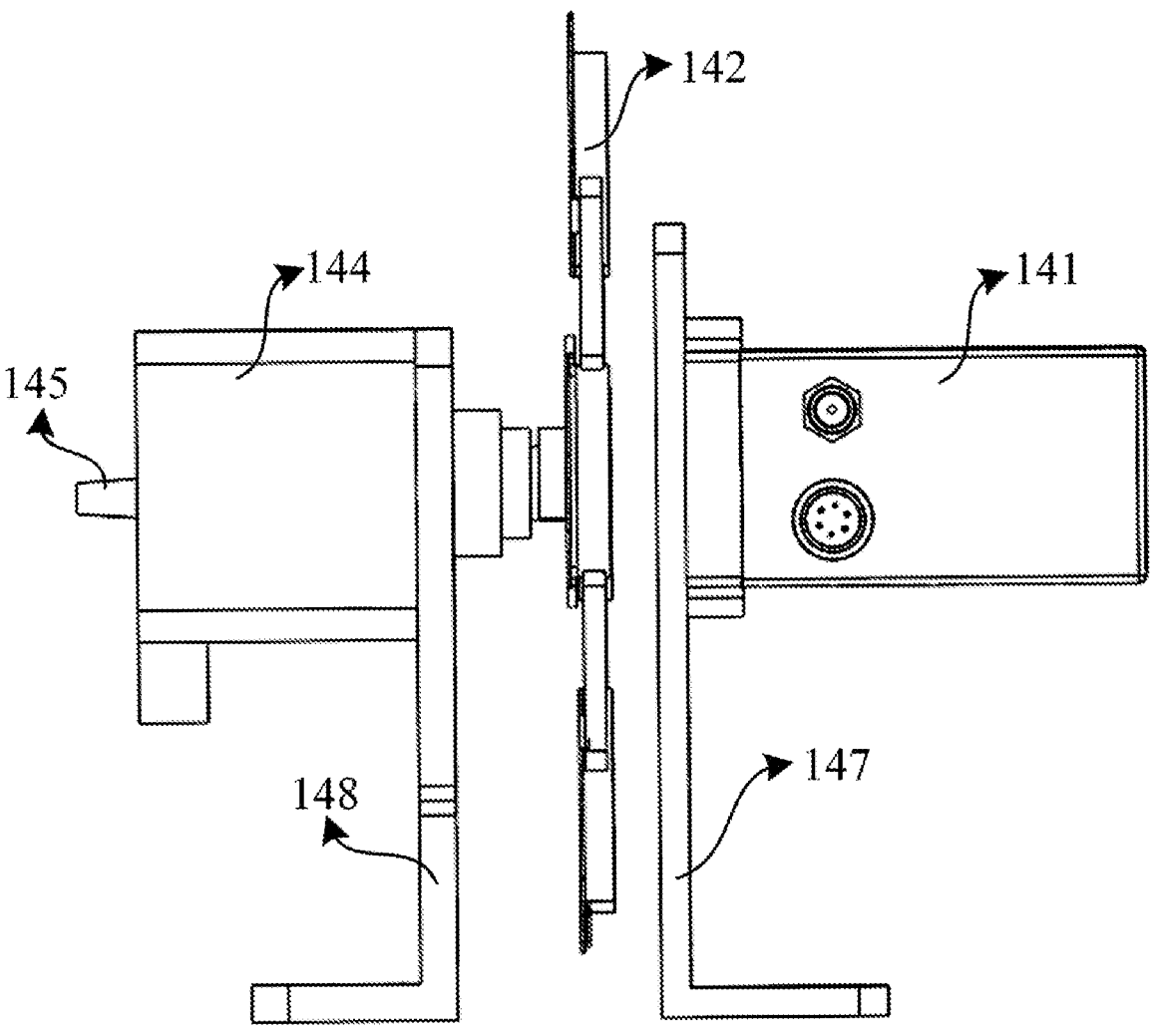
FIG. 29 is a rear view of a fluorescence signal acquisition and analysis apparatus in a fault diagnosis apparatus based on fluorescence multivariate correction analysis of transformer oil according to the present application.
Figure 30:
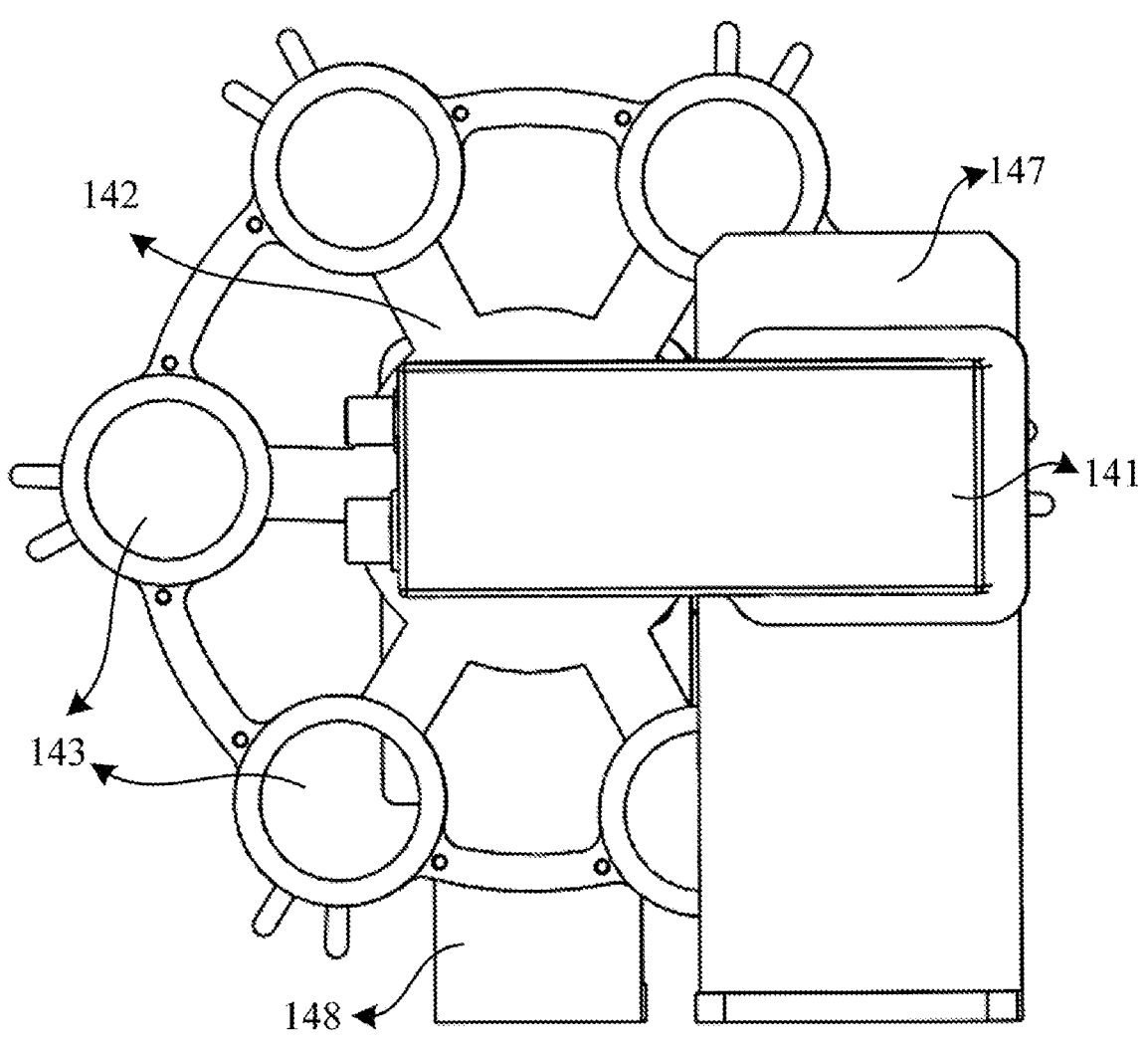
FIG. 30 is a left view of a fluorescence signal acquisition and analysis apparatus in a fault diagnosis apparatus based on fluorescence multivariate correction analysis of transformer oil according to the present application.
Figure 31:
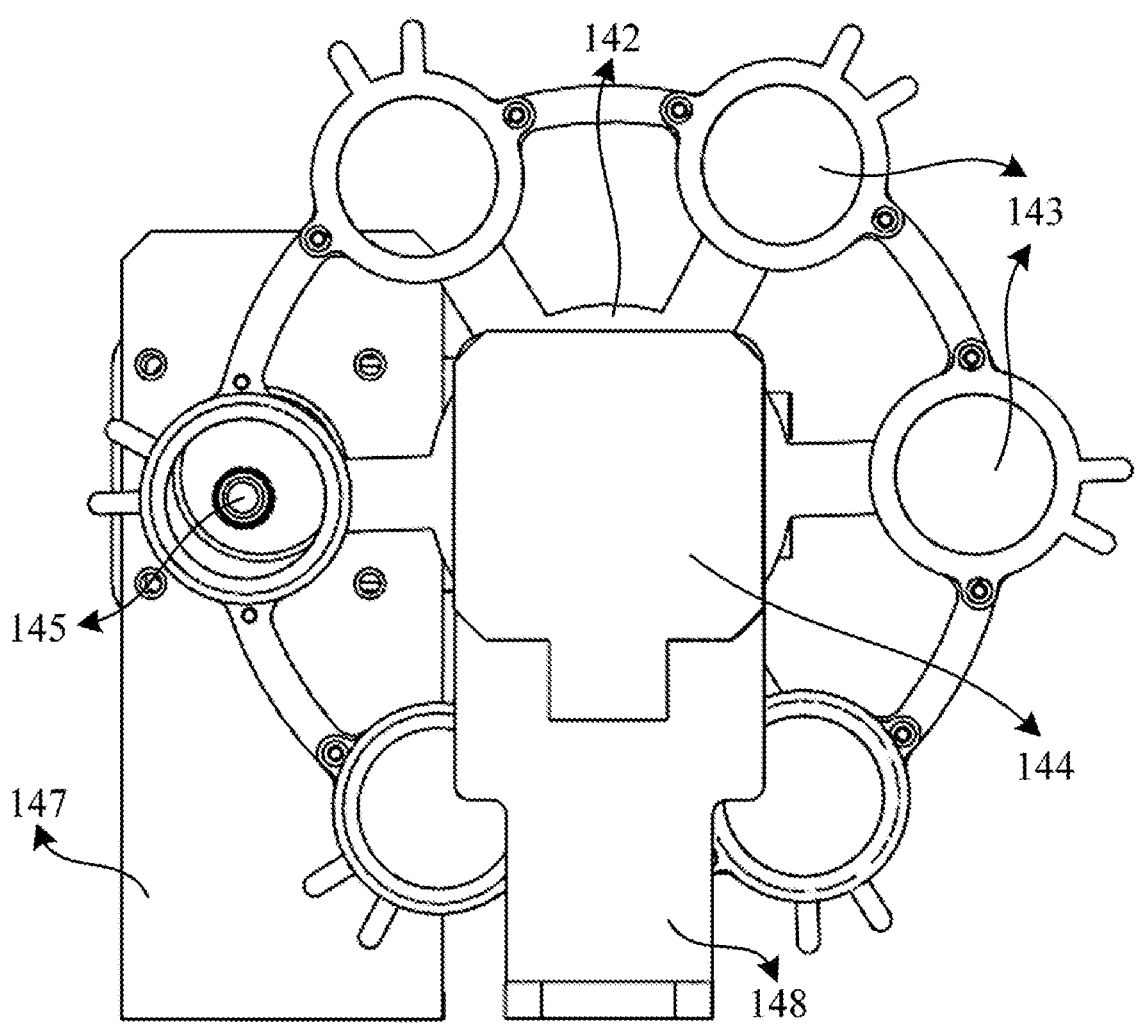
FIG. 31 is a right view of a fluorescence signal acquisition and analysis apparatus in a fault diagnosis apparatus based on fluorescence multivariate correction analysis of transformer oil.
Figure 32:
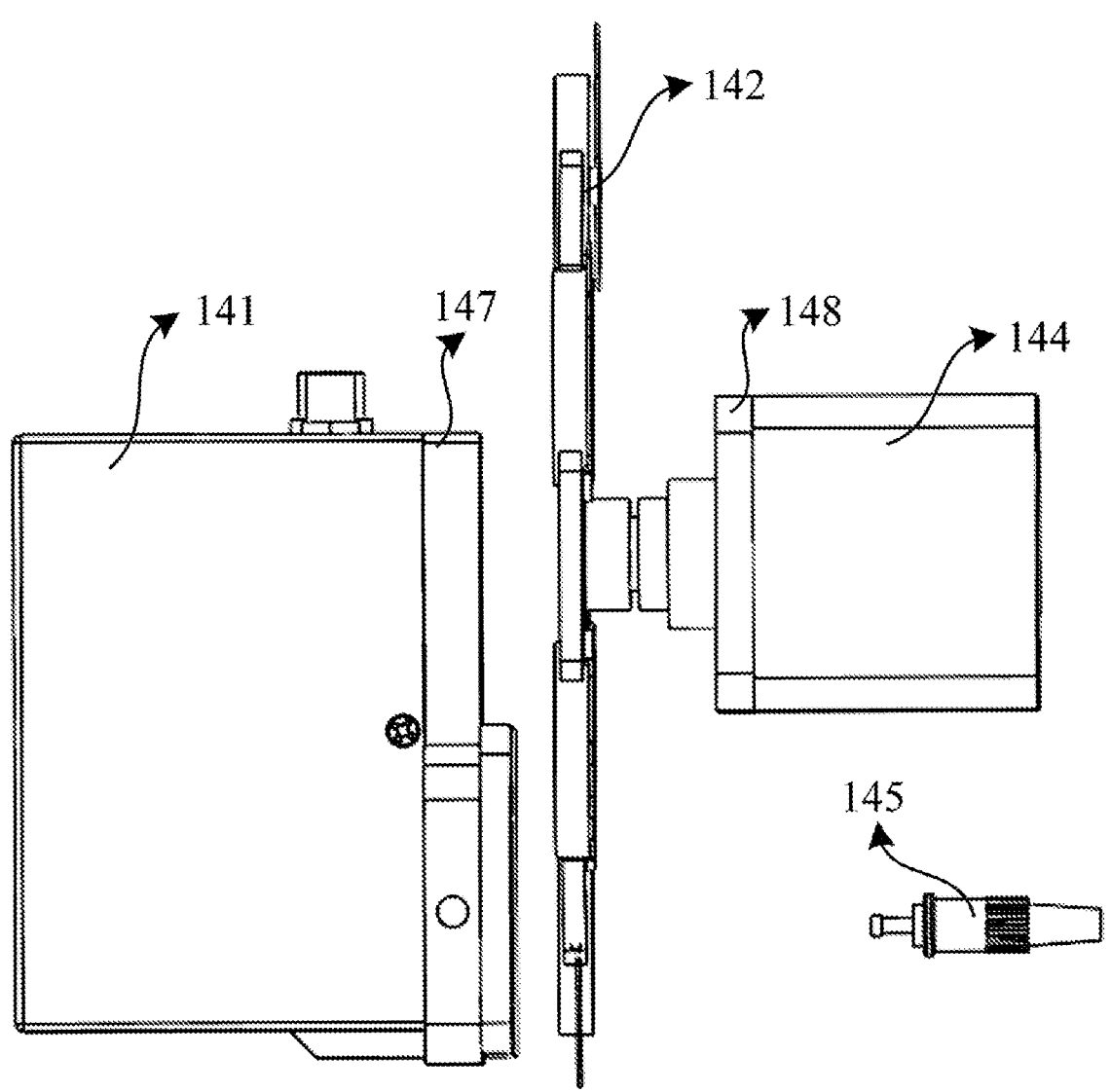
FIG. 32 is a top view of a fluorescence signal acquisition and analysis apparatus in a fault diagnosis apparatus based on fluorescence multivariate correction analysis of transformer oil according to the present application.

As shown in FIG. 19 and FIG. 20, for example, the transformer insulating oil is Karamay oil. A three-dimensional fluorescence spectrum analysis test is performed on the Karamay oil. The excitation wavelength range from 270 nm to 310 nm is selected to compare the peak intensity with the coefficient of variation. It is found that the peak intensity and the coefficient of variation are maximized at the excitation wavelength of 270 nm so that the optimal excitation wavelength is 270 nm.

As shown in FIGS. 21 to 26, the fluorescence excitation detection apparatus 13 includes a detection cell darkroom 1311, a detection cell 1312, a reference cell 1313, an oil inlet pipeline 1314, an oil outlet pipeline 1315, an excitation light emission optical fiber probe 1316, a fluorescence receiving optical fiber probe 1317, an optical fiber head mover 1318, a stepper motor 1319, an excitation light transmission optical fiber head 1320, a fluorescence receiving optical fiber head 1321, an excitation light transmission optical fiber interface 1322, and a fluorescence receiving optical fiber interface 1323.

The detection cell 1312 and the reference cell 1313 are disposed side by side at the bottom of the detection cell darkroom 1311. A side of the detection cell 1312 is formed with an oil inlet and an oil outlet. A first end of the oil inlet pipeline 1314 is connected to the oil inlet in a sealed manner. A second end of the oil inlet pipeline 1314 extends out of the detection cell darkroom 1311. A first end of the oil outlet pipeline 1315 is connected to the oil outlet in a sealed manner. A second end of the oil outlet pipeline 1315 extends out of the detection cell darkroom 1311. The detection cell 1312 and the reference cell 1313 are closed containers. The main body of the container is made of stainless steel. The top of the container is sealed with a visible light-near infrared light quartz glass optical window. The detection cell 1312 is configured to contain the to-be-detected transformer oil. The reference cell 1313 is configured to contain a calibrated standard solution. For example, the standard solution may adopt quinine sulfate, a rhodamine solution, and so on.

The excitation light transmission optical fiber interface 1322 and the fluorescence receiving optical fiber interface 1323 are disposed on the outer top of the detection cell darkroom 1311. A first end of the excitation light transmission optical fiber interface 1322 is connected to the fluorescence excitation source 12, and a first end of the fluorescence receiving optical fiber interface 1323 is connected to the fluorescence detector 141. A second end of the excitation light transmission optical fiber interface 1322 is connected to a first end of the excitation light transmission optical fiber head 1320 disposed on the internal top of the detection cell darkroom 1311, and a second end of the fluorescence receiving optical fiber interface 1323 is connected to a first end of the fluorescence receiving optical fiber head 1321 disposed on the internal top of the detection cell darkroom 1311. A second end of the excitation light transmission optical fiber head 1320 is connected to the excitation light emission optical fiber probe 1316, and a second end of the fluorescence receiving optical fiber head 1321 is connected to the fluorescence receiving optical fiber probe 1317.

The excitation light transmission optical fiber interface 1322 adopts an ST-SC optical fiber connector and is configured to import the excitation light. The fluorescence receiving optical fiber interface 1323 adopts an ST-SC optical fiber connector and is configured to export the fluorescence excited from the transformer oil. The excitation light transmission optical fiber head 1320 is configured to incident the excitation light into the detection cell 1312 or the reference cell 1313. The fluorescence receiving optical fiber head 1321 is configured to receive fluorescence excited in the detection cell 1312 or in the reference cell 1313.

The optical fiber head mover 1318 is disposed above the detection cell 1312 and the reference cell 1313 which are inside the detection cell darkroom 1311. The optical fiber head mover 1318 adopts a walking structure in which a sliding block 13181 and a sliding rod 13182 cooperate.

The excitation light emission optical fiber probe 1316 and the fluorescence receiving optical fiber probe 1317 are disposed on the left and right sides of the sliding block 13181 of the optical fiber head mover 1318 respectively. The included angle between the optical path of the excitation light emission optical fiber probe 1316 and the optical path of the fluorescence receiving optical fiber probe 1317 is 90°. In this manner, the interference of fluorescence scattering light is avoided to the maximum extent, and the signal-to-noise ratio is improved.

The stepper motor 1319 is disposed on the backplane of the detection cell darkroom 1311. The stepper motor 1319 is configured to drive the sliding block 13181 of the optical fiber head mover 1318 to walk back and forth on the sliding rod 13182. Thus, the excitation light emission optical fiber probe 1316 and the fluorescence receiving optical fiber probe 1317 are simultaneously driven to switch between the detection cell 1312 and the reference cell 1313.

The inner wall of the detection cell darkroom 1311 is coated with a light-absorbing coating to prevent external interference ambient light from entering and eliminate the effect of internal multi-reflected light.

In this embodiment, the working process of the fluorescence excitation detection apparatus 13 of the transformer oil is as follows:

(1) The apparatus is calibrated.

In the case where the characteristics of the transformer oil remain unchanged, the factors influencing the fluorescence intensity of the transformer oil are mainly external factors, such as the attenuation of the intensity of a light source, temperature, and the response of the apparatus. For an accurate quantitative detection, the influence of the external factors needs to be eliminated.

Thus, the apparatus needs to be calibrated to obtain the calibration coefficient of the fluorescence excitation detection apparatus 13. The fluorescence spectrum intensity value of the transformer oil is corrected under the current condition through the calibration coefficient to obtain the true fluorescence spectrum intensity value of the transformer oil.

The process of apparatus calibration is as follows:

The fluorescence spectrum intensity value of the standard solution is measured separately under a standard condition and the current external condition, and the detection process of the fluorescence spectrum intensity value is as follows: The stepper motor 1319 drives the optical fiber head mover 1318 to move above the reference cell 1313, and the excitation light is incident into the reference cell 1313 through the excitation light transmission optical fiber interface 1322, the excitation light transmission optical fiber head 1320, and the excitation light emission optical fiber probe 1316 in sequence so that the standard solution in the reference cell 1313 is excited to generate fluorescence; the excited fluorescence is transmitted out through the fluorescence receiving optical fiber probe 1317, the fluorescence receiving optical fiber head 1321, and the fluorescence receiving optical fiber interface 1323 in sequence, and the fluorescence spectrum intensity value of the standard solution is measured by the fluorescence detector 141.

The fluorescence spectrum intensity value $P_{s\_s}$ of the standard solution measured under the standard condition is $s_{s\_s}$·t, and the fluorescence spectrum intensity value $P_{s\_c}$ of the standard solution measured under the standard condition is $s_{s\_c}$·t, in this manner, the calibration coefficient R of the fluorescence excitation detection apparatus 13 is $P_{s\_s}/P_{s\_c}$.

$s_{s\_s}$ denotes the fluorescence spectrum of the standard solution measured under the standard condition, $s_{s\_c}$ denotes the fluorescence spectrum of the standard solution measured under the current external condition, and t denotes the transmittance of the filter of the fluorescence detector 141.

(2) The fluorescence spectrum intensity value of the transformer oil is detected.

When the fluorescence spectrum intensity value of the transformer oil is measured under the current external condition, the detection process is as follows: The stepper motor 1319 drives the optical fiber head mover 1318 to move above the detection cell 1312, and the excitation light is incident into the detection cell 1312 through the excitation light transmission optical fiber interface 1322, the excitation light transmission optical fiber head 1320, and the excitation light emission optical fiber probe 1316 in sequence and excites the transformer oil in the detection cell 1312 to generate the fluorescence; the excited fluorescence is transmitted out through the fluorescence receiving optical fiber probe 1317, the fluorescence receiving optical fiber head 1321, and the fluorescence receiving optical fiber interface 1323 in sequence, the fluorescence spectrum intensity value of the transformer oil under the current external condition is measured by the fluorescence detector 141, and the fluorescence spectrum intensity value of the transformer oil under the current external condition is multiplied by the calibration coefficient so that the true fluorescence spectrum intensity value of the transformer oil is obtained.

As shown in FIGS. 27 to 32, the fluorescence signal acquisition and analysis apparatus 14 includes a fluorescence signal acquisition and analysis darkroom 140, a fluorescence detector 141, a filter wheel 142, a multivariate correction filter group 143, a filter wheel drive motor 144, a second optical fiber head 145, a second optical fiber interface 146, a fluorescence detector mounting bracket 147, and a filter wheel drive motor mounting bracket 148.

The fluorescence detector 141 is fixedly mounted on the fluorescence detector mounting bracket 147. The fluorescence detector mounting bracket 147 is disposed on the internal baseplate of the fluorescence signal acquisition and analysis darkroom 140. The fluorescence detector mounting bracket 147 is formed with a through hole which cooperates with the receiving lens of the fluorescence detector 141. The receiving lens of the fluorescence detector 141 is aligned with the through hole. The inner wall of the fluorescence signal acquisition and analysis darkroom 140 is coated with a light-absorbing coating to prevent external interference ambient light from entering and eliminate the effect of internal multi-reflected light.

The filter wheel drive motor 144 is fixedly mounted on the filter wheel drive motor mounting bracket 148. The filter wheel drive motor mounting bracket 148 is disposed on the internal baseplate of the fluorescence signal acquisition and analysis darkroom 140. The filter wheel 142 is disposed between the fluorescence detector 141 and the filter wheel drive motor 144. The filter wheel 142 sleeves the rotating shaft of the filter wheel drive motor 144. The filter wheel drive motor 144 drives the filter wheel 142 to rotate.

The second optical fiber head 145 is disposed on the internal right sidewall of the fluorescence signal acquisition and analysis darkroom 140. The second optical fiber interface 146 is fixedly disposed on the right sidewall outside the fluorescence signal acquisition and analysis darkroom 140. The second optical fiber head 145 is cooperatively connected to the second optical fiber interface 146.

Figure 33:
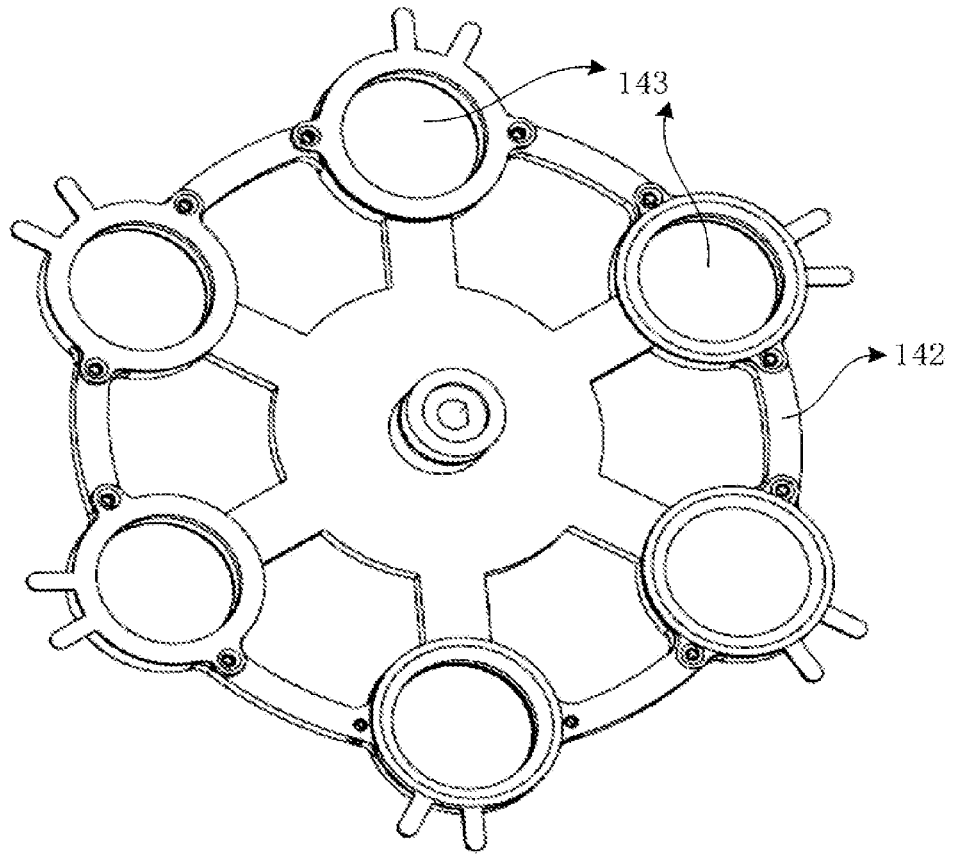
FIG. 33 is a view illustrating the structure of a filter wheel of a fluorescence signal acquisition and analysis apparatus in a fault diagnosis apparatus based on fluorescence multivariate correction analysis of transformer oil according to the present application.

As shown in FIG. 33, the filter wheel 142 is disc-shaped. The edge of the filter wheel 142 is provided with multiple multivariate correction filter groups 143 of different wavelengths. The centerline of the second optical fiber head 145, the centerline of the multivariate correction filter group 143, the centerline of the through hole formed on the fluorescence detector mounting bracket 147, and the centerline of the receiving lens of the fluorescence detector 141 are in one straight line.

The working process of the apparatus is as follows:

The filter wheel drive motor 144 drives the filter wheel 142 to rotate. The multivariate correction filter group 143 of a corresponding wavelength is switched and is aligned with the receiving lens of the fluorescence detector 141. The fluorescence emitted by the transformer oil sequentially passes through the second optical fiber interface 146, the second optical fiber head 145, the multivariate correction filter group 143, the through hole formed on the fluorescence detector mounting bracket 147, and the receiving lens of the fluorescence detector 141. The multivariate correction filter group 143 is configured to acquire and analyze the fluorescence emitted by the transformer oil. The fluorescence detector 141 adopts a photomultiplier tube and is configured to receive the fluorescence emitted by the transformer oil and record the total fluorescence intensity value.

The design method of the multivariate correction filter group 143 is as follows:

The design idea of multivariate correction filters is to perform hardwareization on a multivariate linear regression correction coefficient vector for calculating the concentration of an aromatic hydrocarbon compound, and the hardwareization of the multivariate correction coefficient is performed by designing positive and negative correction filters.

The fluorescence spectrum of the transformer oil is directly related to the concentration of the aromatic hydrocarbon compound. The calculation formula for calculating the concentration of the aromatic hydrocarbon compound by using multivariate linear regression is as follows:

$$c = a_1 s_1 + a_2 s_2 + \ldots + a_n s_n + b.$$

c denotes the concentration of an aromatic hydrocarbon. $a_1$ to $a_n$ denote the regression correction coefficients of fluorescence spectrums obtained in the first band to an $n^{th}$ band. $s_1$ to $s_n$ denote the fluorescence spectrums obtained in the first band to the $n^{th}$ band. b denotes a biasing coefficient.

The vector form of the multivariate linear regression correction calculation formula for the concentration of the aromatic hydrocarbon compound is as follows:

$$c = s \cdot a + b.$$

$a=(a_1, a_2 \ldots a_n)$, and a denotes a regression correction coefficient vector. $s=(s_1, s_2 \ldots s_n)^T$, and s denotes a fluorescence spectrum vector.

Figure 34:
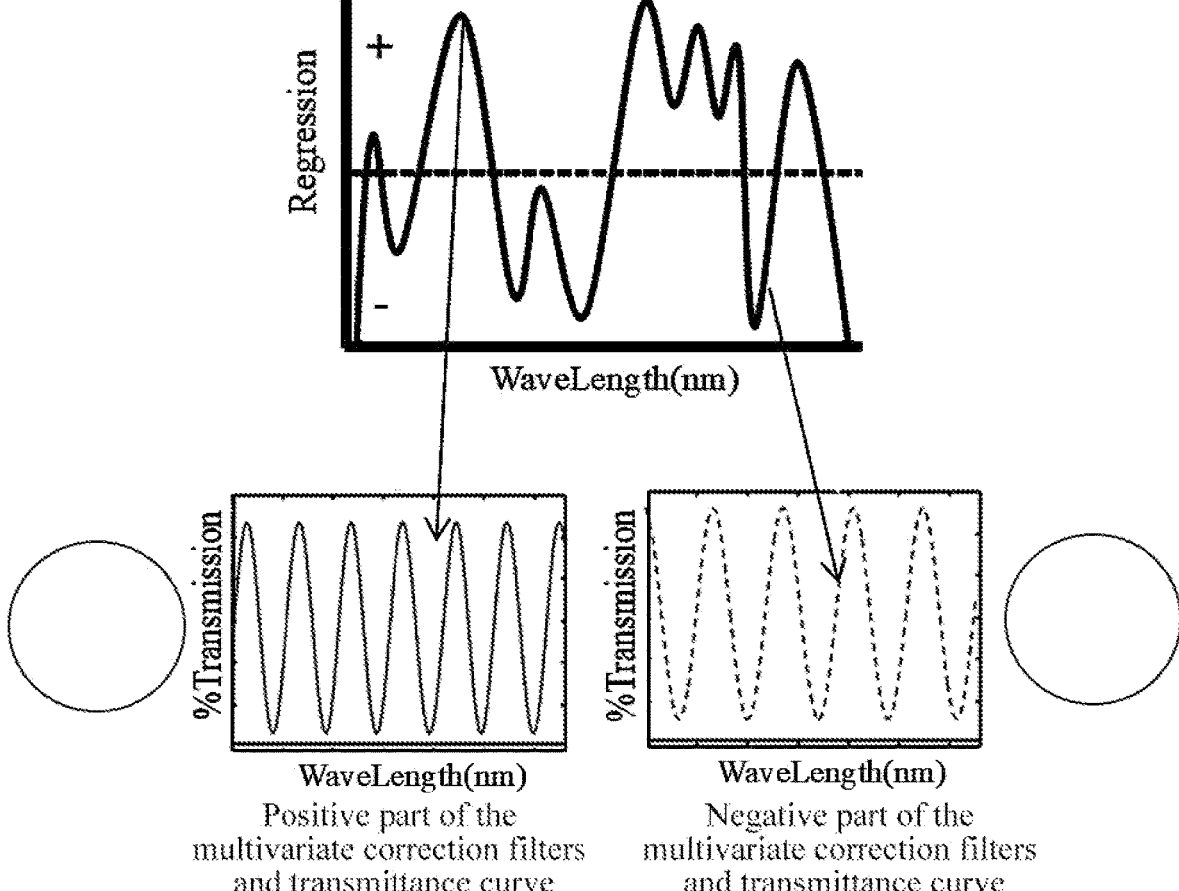
FIG. 34 is a diagram illustrating the calculation principle of the transmittance of a multivariate correction filter of a fluorescence signal acquisition and analysis apparatus in a fault diagnosis apparatus based on fluorescence multivariate correction analysis of transformer oil according to the present application.

As shown in FIG. 34, the positive and negative parts of the regression correction coefficient vector a are made into two correction filters, that is, the positive and negative coefficients obtained after the regression correction coefficient vector a is standardized are used as the transmittance of the filters.

Half coefficients $a_i^+$ and $a_i^-$ are defined and used as the positive and negative parts of $a_i$, that is, $$a_i^+ = \begin{cases} a_i, & a_i > 0 \\ 0, & a_i \le 0 \end{cases}, \text{ and } a_i^- = \begin{cases} 0, & a_i \ge 0 \\ -a_i, & a_i < 0 \end{cases}.$$

The maximum value of the half coefficients is found as follows:

$$m = \max(a_i^+ \text{ or } a_i^-).$$

Thus, the transmittance of the positive filter and the transmittance of the negative filter are obtained as follows:

$$t_i^+ = a_i^+/m, \text{ and } t_i^- = a_i^-/m.$$

Assuming that the current detected target fluorescence spectrum is $s_i$, the energy received by the fluorescence detector 141 is expressed as follows:

$$P^+ = s_i \cdot t^+, \text{ and } P^- = s_i \cdot t^-.$$

$P^+$ and $P^-$ are measured respectively, and the final concentration c of the aromatic hydrocarbon is calculated as follows:

$$c = c^+ - c^- + b = (P^+ - P^-)m + b.$$

$c^+=(P^+)m$. $c^-=(P^-)m$. i=1, 2, . . . , n, and n is a natural number. $a_i$ denotes an $i^{th}$ element of regression correction coefficient vector a. $t_i^+$ denotes an $i^{th}$ element of vector $t^+$. $t_i^-$ denotes an $i^{th}$ element of vector $t^-$.

Figure 35:
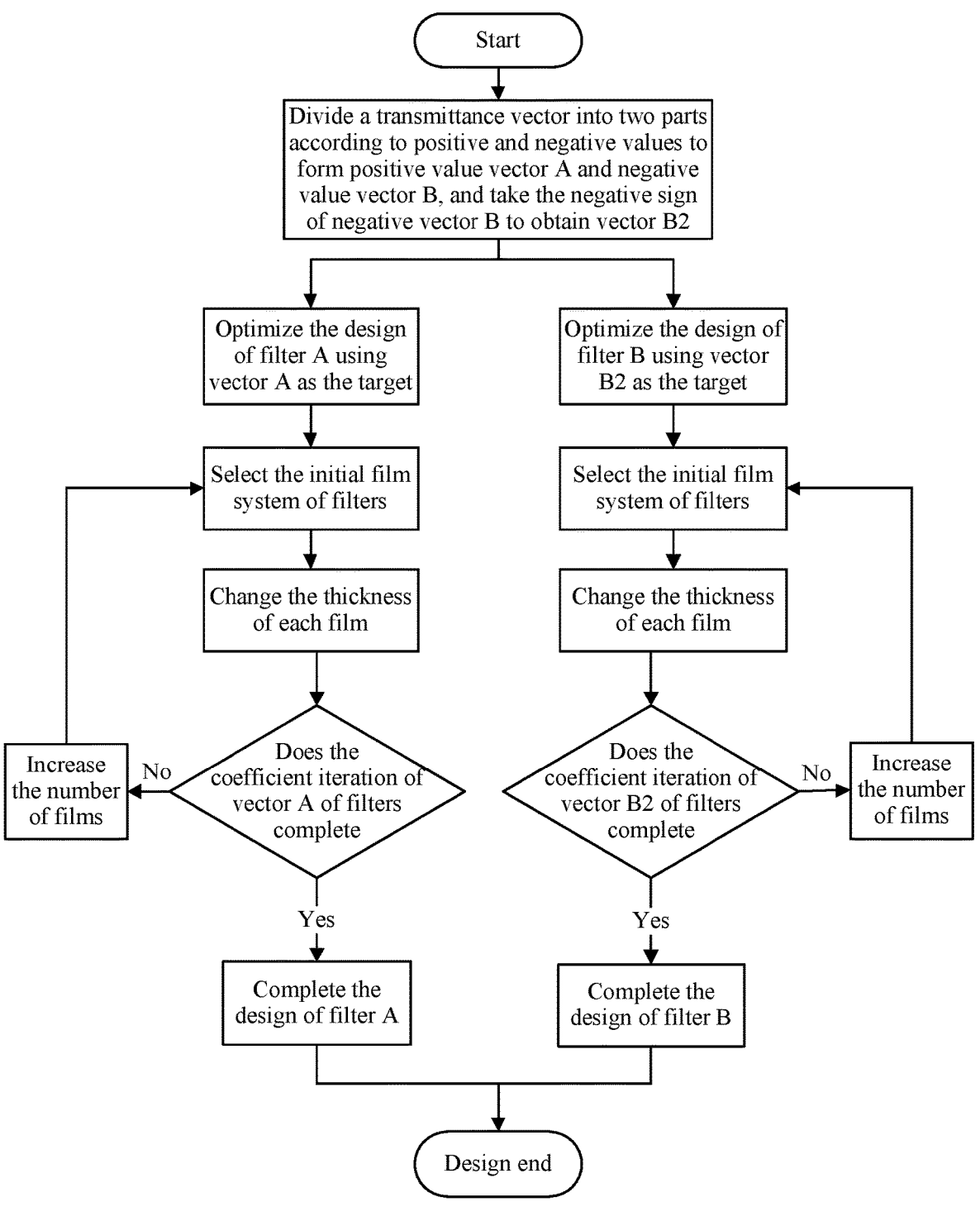
FIG. 35 is a design flowchart for a film system of a multivariate correction filter of a fluorescence signal acquisition and analysis apparatus in a fault diagnosis apparatus based on fluorescence multivariate correction analysis of transformer oil according to the present application.

As shown in FIG. 35, a design process of the film system is as follows: The transmittance vector t of a filter is divided into two parts according to positive and negative values to form positive value vector A and negative value vector B, the absolute value of negative value vector B is taken to obtain vector B2, and the positive filter and the negative filter are optimally designed with vector A and vector B2 as targets. First, the initial film system of the filters is selected, then the thickness of each film is changed, and whether the similarity between the transmittance of the filters and the vector A and the vector B2 reaches a threshold value is determined, if so, the positive filter and the negative filter are designed, otherwise, it is determined whether the iteration reaches the predetermined number of times; if the iteration does not reach the predetermined number of times, the thickness of each film is continuously changed; and if the iteration reaches the predetermined number of times, the initial film system of the filters is reselected after the number of films in the film system is increased.

Compared with the related art, the present application includes at least the following benefits:

(1) In the present application, the monochromatic excitation light having an optimal excitation wavelength which is generated by the fluorescence excitation source 12 is used for exciting the transformer oil in the fluorescence excitation detection apparatus 13 to generate the fluorescence. The fluorescence excitation detection apparatus 13 generates the fluorescence according to the input monochromatic excitation light and inputs the fluorescence into the fluorescence signal acquisition and analysis apparatus 14. The fluorescence signal acquisition and analysis apparatus 14 acquires the fluorescence signal emitted by the transformer oil by using the multivariate correction filter group 143 and analyzes the type of a transformer failure. The multivariate correction filter group 143 is configured to acquire and analyze the fluorescence signal emitted by the transformer oil, so the emission monochromator component of the fluorescence spectrometer is replaced. In this manner, not only the equipment costs and the equipment volume are reduced, but also data processing is rapid. Thus, the cost performance of the fault detection of the transformer oil is improved, and a transformer fault diagnosis apparatus having a simple structure, a portable volume, and a reliable function is formed, thereby implementing the engineering application of the fluorescence monitoring technology in the online diagnosis of the transformer failure.

(2) In the present application, the oil extraction apparatus 11 first evacuates the internal pipeline of the oil extraction apparatus 11 and the detection cell 1312 through the air pump 114, thereby preventing the impurity gas in the oil extraction apparatus 11 and the impurity gas in the fluorescence excitation detection apparatus from being filled into the transformer oil tank, which affects the insulation performance of the transformer. Then, the transformer oil in the transformer oil tank is extracted into the detection cell 1312 according to the pressure difference between the oil outlet of the transformer oil tank and the evacuated detection cell 1312. At this time, the oil extraction pump 113 does not operate, so that the detection costs are saved. After the detection is completed, the transformer oil in the detection cell 1312 is extracted by the oil extraction pump 113 and pressed back into the transformer oil tank. In this manner, lossless detection can be implemented, and the waste of resources is avoided.

(3) In the present application, the fluorescence excitation source 12 compares the peak intensity and the dispersion degree of the sample characteristics at different excitation wavelengths, and selects and uses an excitation wavelength at which the peak intensity and the coefficient of variation are maximized as the excitation wavelength of the monochromatic optimal wavelength LED excitation light source 121. The monochromatic optimal wavelength LED excitation light source 121 emits monochromatic excitation light, and the excitation light is converged onto the optical fiber head 125 through the converging lens 123. The optical fiber head 125 is configured to collect the excitation light and transmit the excitation light through the first optical fiber interface 126 for exciting the transformer oil to generate the fluorescence. The fault diagnosis apparatus of the present application has a simple structure. Compared with the related art which directly uses a fluorescence spectrometer for excitation, the fault diagnosis apparatus of the present application can greatly reduce the volume and weight of the apparatus and make it easy to use. Moreover, the fault diagnosis apparatus uses a monochromatic LED excitation light source, which has long service life and low costs.

(4) In the present application, the fluorescence excitation detection apparatus 13 is provided with the detection cell 1312 and the reference cell 1313. First, the fluorescence excitation detection apparatus 13 is calibrated by the reference cell 1313 to calculate the calibration coefficient of the fluorescence excitation detection apparatus 13. Then, the fluorescence spectrum intensity value of the transformer oil measured by the detection cell 1312 is corrected by using the calibration coefficient so that the true fluorescence spectrum intensity value of the transformer oil is obtained. In this manner, the interference of external factors can be eliminated, and the detection accuracy of the fluorescence excitation detection apparatus 13 is improved.

What is claimed is:

1. A fault diagnosis apparatus based on fluorescence multivariate correction analysis of transformer oil, the fault diagnosis apparatus comprising:

an apparatus housing, an oil extraction apparatus, a fluorescence excitation source, a fluorescence excitation detection apparatus, a fluorescence signal acquisition and analysis apparatus, and a display screen, wherein the oil extraction apparatus, the fluorescence excitation source, the fluorescence excitation detection apparatus, and the fluorescence signal acquisition and analysis apparatus are disposed inside the apparatus housing, and the display screen is disposed on a front panel of the apparatus housing;

wherein the oil extraction apparatus is sealedly connected to the fluorescence excitation detection apparatus and an external transformer oil tank respectively through pipelines, the fluorescence excitation source is connected to the fluorescence excitation detection apparatus through an optical fiber, and the fluorescence excitation detection apparatus is connected to the fluorescence signal acquisition and analysis apparatus through an optical fiber;

wherein the oil extraction apparatus comprises an air pump and an oil inlet valve; the air pump is configured to extract impurity gas in an internal pipeline of the oil extraction apparatus and impurity gas in a detection cell of the fluorescence excitation detection apparatus; and the oil inlet valve is configured to control an on-state of a flow of the transformer oil from the transformer oil tank into the detection cell of the fluorescence excitation detection apparatus, which is driven by a pressure difference between an oil outlet of the transformer oil tank and the evacuated detection cell;

wherein the fluorescence excitation source comprises a monochromatic optimal wavelength light-emitting diode (LED) excitation light source, the monochromatic optimal wavelength LED excitation light source is configured to emit monochromatic excitation light having an optimal excitation wavelength, and the monochromatic excitation light is used for exciting the transformer oil in the fluorescence excitation detection apparatus to generate fluorescence;

wherein the fluorescence excitation detection apparatus is configured to generate the fluorescence by exciting the transformer oil with the input monochromatic excitation light, and to input the fluorescence into the fluorescence signal acquisition and analysis apparatus;

wherein the fluorescence signal acquisition and analysis apparatus comprises a multivariate correction filter group, the multivariate correction filter group is configured to acquire a fluorescence signal emitted by the transformer oil and to perform hardwareization on a multivariate linear regression correction coefficient vector for calculating a concentration of an aromatic hydrocarbon compound, wherein the multivariate linear regression correction coefficient vector for calculating the concentration of the aromatic hydrocarbon compound is $c=a_1s_1+a_2s_2+ \ldots +a_ns_n+b$, where c denotes the concentration of the aromatic hydrocarbon compound, $a_1$ to $a_n$ denote regression correction coefficients of fluorescence spectra obtained at a 1st to nth bands, $s_1$ to $s_n$ denote the fluorescence spectra obtained at the 1st to nth bands, and b denotes a biasing coefficient, and the fluorescence signal acquisition and analysis apparatus is configured to analyze a type of failure of a transformer based on a result of the hardwareization; and wherein the display screen is configured to display a result acquired and analyzed by the fluorescence signal acquisition and analysis apparatus.

2. The fault diagnosis apparatus based on fluorescence multivariate correction analysis of transformer oil according to claim 1, wherein the oil extraction apparatus further comprises an oil outlet valve, an oil extraction pump, a two-way oil inlet, a three-way oil and air drain, an apparatus baseplate, and a mounting bracket, wherein the oil inlet valve, the oil outlet valve, the oil extraction pump, and the air pump are fixedly mounted on the apparatus baseplate;

wherein the two-way oil inlet and the three-way oil and air drain are fixedly mounted on the mounting bracket, and the mounting bracket is fixedly mounted on the apparatus baseplate;

wherein the oil extraction pump is configured to extract the detected transformer oil from the detection cell of the fluorescence excitation detection apparatus;

wherein the air pump is configured to extract impurity gas in an internal pipeline of the oil extraction apparatus and impurity gas in the detection cell of the fluorescence excitation detection apparatus;

wherein a first end of the oil inlet valve is connected to an oil outlet of the transformer oil tank, a second end of the oil inlet valve is connected to a first end of the two-way oil inlet, and a second end of the two-way oil inlet is connected to an oil inlet of the fluorescence excitation detection apparatus; and wherein a first end of the oil extraction pump is connected to a first port of the three-way oil and air drain, a second end of the oil extraction pump is connected to an oil outlet of the fluorescence excitation detection apparatus, a second port of the three-way oil and air drain is connected to a first end of the oil outlet valve, a second end of the oil outlet valve is connected to an oil inlet of the transformer oil tank, and a third port of the three-way oil and air drain is connected to an end of the air pump.

3. The fault diagnosis apparatus based on fluorescence multivariate correction analysis of transformer oil according to claim 2, wherein the fluorescence excitation source further comprises a fluorescence excitation darkroom, a converging lens, an optical fiber head, and a first optical fiber interface, wherein the monochromatic optimal wavelength LED excitation light source, the converging lens, and the optical fiber head are each fixedly disposed inside the fluorescence excitation darkroom, the converging lens is disposed between the monochromatic optimal wavelength LED excitation light source and the optical fiber head, and a centerline of the monochromatic optimal wavelength LED excitation light source, a centerline of the converging lens, and a centerline of the first optical fiber interface are in one straight line.

4. The fault diagnosis apparatus based on fluorescence multivariate correction analysis of transformer oil according to claim 3, wherein the fluorescence excitation source further comprises an excitation light source mounting bracket and a lens mounting bracket;

wherein the excitation light source mounting bracket is fixedly disposed on an internal baseplate of the fluorescence excitation darkroom, and the monochromatic optimal wavelength LED excitation light source is mounted on the excitation light source mounting bracket; the lens mounting bracket is fixedly disposed on the internal baseplate of the fluorescence excitation darkroom, and the converging lens is embedded in the lens mounting bracket; and wherein the first optical fiber interface is fixedly disposed on a sidewall outside the fluorescence excitation darkroom, and the optical fiber head is cooperatively connected to the first optical fiber interface.

5. The fault diagnosis apparatus based on fluorescence multivariate correction analysis of transformer oil according to claim 1, wherein the fluorescence excitation detection apparatus comprises a detection cell darkroom, the detection cell, a reference cell, an excitation light emission optical fiber probe, a fluorescence receiving optical fiber probe, an optical fiber head mover, an excitation light transmission optical fiber head, a fluorescence receiving optical fiber head, an excitation light transmission optical fiber interface, and a fluorescence receiving optical fiber interface, wherein the detection cell and the reference cell are disposed side by side at a bottom of the detection cell darkroom, the detection cell is a container provided with an oil inlet and an oil outlet and configured to contain the to-be-detected transformer oil, and the reference cell is a closed container and configured to contain a calibrated standard solution;

wherein the excitation light transmission optical fiber interface and the fluorescence receiving optical fiber interface are disposed on an outer top of the detection cell darkroom, a first end of the excitation light transmission optical fiber interface and a first end of the fluorescence receiving optical fiber interface are connected to the fluorescence excitation source and the fluorescence signal acquisition and analysis apparatus respectively, a second end of the excitation light transmission optical fiber interface is connected to a first end of the excitation light transmission optical fiber head disposed inside the detection cell darkroom, a second end of the fluorescence receiving optical fiber interface is connected to a first end of the fluorescence receiving optical fiber head disposed inside the detection cell darkroom, a second end of the excitation light transmission optical fiber head is connected to the excitation light emission optical fiber probe, and a second end of the fluorescence receiving optical fiber head is connected to the fluorescence receiving optical fiber probe; and wherein the optical fiber head mover is disposed above the detection cell and the reference cell which are disposed inside the detection cell darkroom, the excitation light emission optical fiber probe and the fluorescence receiving optical fiber probe are disposed on two sides of the optical fiber head mover respectively, and the optical fiber head mover drives the excitation light emission optical fiber probe and the fluorescence receiving optical fiber probe simultaneously to switch between the detection cell and the reference cell.

6. The fault diagnosis apparatus based on fluorescence multivariate correction analysis of transformer oil according to claim 5, wherein an included angle between an optical path of the excitation light emission optical fiber probe and an optical path of the fluorescence receiving optical fiber probe is 90°.

7. The fault diagnosis apparatus based on fluorescence multivariate correction analysis of transformer oil according to claim 5, wherein the fluorescence excitation detection apparatus further comprises an oil inlet pipeline and an oil outlet pipeline; and a side of the detection cell is formed with the oil inlet and the oil outlet, a first end of the oil inlet pipeline is connected to the oil inlet of the detection cell in a sealed manner, a second end of the oil inlet pipeline extends out of the detection cell darkroom, a first end of the oil outlet pipeline is connected to the oil outlet of the detection cell in a sealed manner, and a second end of the oil outlet pipeline extends out of the detection cell darkroom.

8. The fault diagnosis apparatus based on fluorescence multivariate correction analysis of transformer oil according to claim 7, wherein the fluorescence excitation detection apparatus further comprises a stepper motor, the optical fiber head mover comprises a sliding block and a sliding rod, and the excitation light emission optical fiber probe and the fluorescence receiving optical fiber probe are disposed on left and right sides of the sliding block of the optical fiber head mover respectively; and wherein the stepper motor is disposed on a backplane of the detection cell darkroom, and the stepper motor is configured to drive the sliding block of the optical fiber head mover to slide back and forth on the sliding rod so that the excitation light emission optical fiber probe and the fluorescence receiving optical fiber probe are simultaneously driven to switch between the detection cell and the reference cell.

9. The fault diagnosis apparatus based on fluorescence multivariate correction analysis of transformer oil according to claim 5, wherein the fluorescence signal acquisition and analysis apparatus further comprises a fluorescence signal acquisition and analysis darkroom, a fluorescence detector, a filter wheel, a second optical fiber head, and a second optical fiber interface, wherein the fluorescence detector and the filter wheel are disposed inside the fluorescence signal acquisition and analysis darkroom;

wherein the multivariate correction filter group is formed by combining a pair of a positive multivariate correction filter and a negative multivariate correction filter used in conjunction, the multivariate correction filter group is mounted on the filter wheel, and the filter wheel is rotatably disposed between the fluorescence detector and the second optical fiber head; the second optical fiber head is disposed on an internal sidewall of the fluorescence signal acquisition and analysis darkroom, the second optical fiber interface is disposed on a sidewall outside the fluorescence signal acquisition and analysis darkroom, and the second optical fiber head is cooperatively connected to the second optical fiber interface;

wherein the fluorescence receiving optical fiber interface is connected to the second optical fiber interface through an optical fiber;

wherein the fluorescence detector is configured to receive the fluorescence signal emitted by the transformer oil and record a total fluorescence intensity value, and the multivariate correction filter group is configured to acquire and analyze the fluorescence signal emitted by the transformer oil; and wherein, when the multivariate correction filter group is in use, the positive multivariate correction filter or the negative multivariate correction filter is rotated in place so that a centerline of the second optical fiber head, one of a centerline of the positive multivariate correction filter or a centerline of the negative multivariate correction filter, and a centerline of a receiving lens of the fluorescence detector are in one straight line, and the fluorescence emitted by the transformer oil passes sequentially through the second optical fiber interface, the second optical fiber head, one of the positive multivariate correction filter or the negative multivariate correction filter, and the receiving lens of the fluorescence detector.

10. The fault diagnosis apparatus based on fluorescence multivariate correction analysis of transformer oil according to claim 9, wherein the fluorescence signal acquisition and analysis apparatus further comprises a filter wheel drive motor, a fluorescence detector mounting bracket, and a filter wheel drive motor mounting bracket, wherein the fluorescence detector mounting bracket is disposed on an internal baseplate of the fluorescence signal acquisition and analysis darkroom, and the fluorescence detector is fixedly mounted on the fluorescence detector mounting bracket;

wherein the fluorescence detector mounting bracket is formed with a through hole which cooperates with the receiving lens of the fluorescence detector, and the receiving lens of the fluorescence detector is aligned with the through hole; and wherein the filter wheel drive motor is fixedly mounted on the filter wheel drive motor mounting bracket, the filter wheel drive motor mounting bracket is disposed on the internal baseplate of the fluorescence signal acquisition and analysis darkroom, the filter wheel sleeves a rotating shaft of the filter wheel drive motor, and the filter wheel drive motor is configured to drive the filter wheel to rotate.

11. A fault diagnosis method based on fluorescence multivariate correction analysis of transformer oil, applied to a fault diagnosis apparatus, wherein the fault diagnosis apparatus comprises: an apparatus housing, an oil extraction apparatus, a fluorescence excitation source, a fluorescence excitation detection apparatus, a fluorescence signal acquisition and analysis apparatus, and a display screen, wherein the oil extraction apparatus is sealedly connected to the fluorescence excitation detection apparatus and an external transformer oil tank respectively through pipelines;

wherein the oil extraction apparatus comprises an air pump and an oil inlet valve, the fluorescence excitation source comprises a monochromatic optimal wavelength light-emitting diode (LED) excitation light source, and the fluorescence signal acquisition and analysis apparatus comprises a multivariate correction filter group; and wherein the method comprises:

extracting, by the air pump, impurity gas in an internal pipeline of the oil extraction apparatus and impurity gas in a detection cell of the fluorescence excitation detection apparatus, and controlling, by the oil inlet valve, an on-state of a flow of the transformer oil from the transformer oil tank into the detection cell of the fluorescence excitation detection apparatus, which is driven by a pressure difference between an oil outlet of the transformer oil tank and the evacuated detection cell;

emitting, by the monochromatic optimal wavelength LED excitation light source, monochromatic excitation light having an optimal excitation wavelength, and the monochromatic excitation light is used for exciting the transformer oil in the fluorescence excitation detection apparatus to generate fluorescence;

generating, by the fluorescence excitation detection apparatus, the fluorescence by exciting the transformer oil with the input monochromatic excitation light, and inputting, by the fluorescence excitation detection apparatus, the fluorescence into the fluorescence signal acquisition and analysis apparatus;

acquiring, by the multivariate correction filter group, a fluorescence signal emitted by the transformer oil, and performing, by the multivariate correction filter group, hardwareization on a multivariate linear regression correction coefficient vector for calculating a concentration of an aromatic hydrocarbon compound, wherein the multivariate linear regression correction coefficient vector for calculating the concentration of the aromatic hydrocarbon compound is $c=a_1s_1+a_2s_2+ \ldots +a_ns_n+b$, where c denotes the concentration of the aromatic hydrocarbon compound, $a_1$ to $a_n$ denote regression correction coefficients of fluorescence spectra obtained at a 1st to nth bands, $s_1$ to $s_n$ denote the fluorescence spectra obtained at the 1st to nth bands, and b denotes a biasing coefficient;

analyzing, by the fluorescence signal acquisition and analysis apparatus, a type of failure of a transformer based on a result of the hardwareization; and displaying, by the display screen, a result acquired and analyzed by the fluorescence signal acquisition and analysis apparatus.

12. The fault diagnosis method based on fluorescence multivariate correction analysis of transformer oil according to claim 11, wherein the oil extraction apparatus further comprises an oil outlet valve and an oil extraction pump, and wherein a working process of the oil extraction apparatus comprises:

evacuating the internal pipeline of the oil extraction apparatus and the detection cell, wherein evacuating the internal pipeline of the oil extraction apparatus and the detection cell comprises: closing the oil inlet valve and the oil outlet valve, configuring the oil extraction pump to be in a normally-on mode, starting the air pump to evacuate the internal pipeline of the oil extraction apparatus and the detection cell, and configuring the oil extraction pump to be in a closed mode and closing the air pump after evacuation is completed;

inputting the transformer oil into the detection cell, wherein inputting the transformer oil into the detection cell comprises: opening the oil inlet valve to enable the transformer oil from the transformer oil tank into the detection cell according to the pressure difference between the oil outlet of the transformer oil tank and the evacuated detection cell, and closing the oil inlet valve after oil input is completed; and backfilling the transformer oil into the transformer oil tank, wherein backfilling the transformer oil into the transformer oil tank comprises: opening the oil outlet valve after detection is completed, configuring the air pump to be in a closed mode, and starting the oil extraction pump to extract the transformer oil from the detection cell and press the transformer oil back into the transformer oil tank.

13. The fault diagnosis method based on fluorescence multivariate correction analysis of transformer oil according to claim 11, wherein the fluorescence excitation detection apparatus comprises a detection cell darkroom, the detection cell, a reference cell, an excitation light emission optical fiber probe, a fluorescence receiving optical fiber probe, an optical fiber head mover, an excitation light transmission optical fiber head, a fluorescence receiving optical fiber head, an excitation light transmission optical fiber interface, and a fluorescence receiving optical fiber interface;

wherein the fluorescence excitation detection apparatus is configured to detect a fluorescence spectrum intensity value of the transformer oil in the following manner:

moving the optical fiber head mover above the detection cell, wherein excitation light is incident into the detection cell through the excitation light transmission optical fiber interface, the excitation light transmission optical fiber head, and the excitation light emission optical fiber probe in sequence and excites the transformer oil in the detection cell to generate the fluorescence; and transmitting the excited fluorescence out through the fluorescence receiving optical fiber probe, the fluorescence receiving optical fiber head, and the fluorescence receiving optical fiber interface in sequence, and measuring, by a fluorescence detector, a fluorescence spectrum intensity value of the transformer oil under a current external condition; and multiplying the fluorescence spectrum intensity value of the transformer oil under the current external condition by a calibration coefficient of the fluorescence excitation detection apparatus to obtain the true fluorescence spectrum intensity value of the transformer oil.

14. The fault diagnosis method based on fluorescence multivariate correction analysis of transformer oil according to claim 13, wherein the calibration coefficient of the fluorescence excitation detection apparatus is determined in the following manner:

measuring a fluorescence spectrum intensity value of the standard solution under a standard condition and a fluorescence spectrum intensity value of the standard solution under the current external condition and moving the optical fiber head mover above the reference cell, wherein the excitation light is incident into the reference cell through the excitation light transmission optical fiber interface, the excitation light transmission optical fiber head, and the excitation light emission optical fiber probe in sequence and excites the standard solution in the reference cell to generate fluorescence; and transmitting the excited fluorescence out through the fluorescence receiving optical fiber probe, the fluorescence receiving optical fiber head, and the fluorescence receiving optical fiber interface in sequence and measuring, by the fluorescence detector, a fluorescence spectrum intensity value of the standard solution, wherein the fluorescence spectrum intensity value $P_{s\_s}$ of the standard solution measured under the standard condition is equal to $s_{s\_s} \cdot t$, the fluorescence spectrum intensity value $P_{s\_c}$ of the standard solution measured under the current external condition is equal to $s_{s\_c} \cdot t$, and the calibration coefficient R of the fluorescence excitation detection apparatus is equal to $P_{s\_s}/P_{s\_c}$, wherein $s_{s\_s}$ denotes a fluorescence spectrum of the standard solution measured under the standard condition, $s_{s\_c}$ denotes a fluorescence spectrum of the standard solution measured under the current external condition, and t denotes a transmittance of a filter of the fluorescence detector.

* * * * *